(12) United States Patent
Oyabe et al.

(10) Patent No.: US 7,507,023 B2
(45) Date of Patent: Mar. 24, 2009

(54) TEMPERATURE MEASUREMENT DEVICE OF POWER SEMICONDUCTOR DEVICE

(75) Inventors: Kazunori Oyabe, Nagano (JP);
Tomoyuki Yamazaki, Nagano (JP);
Yasushi Miyasaka, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 261 days.

(21) Appl. No.: 11/404,095

(22) Filed: Apr. 14, 2006

(65) Prior Publication Data
US 2006/0255361 A1 Nov. 16, 2006

(30) Foreign Application Priority Data
Apr. 15, 2005 (JP) .............................. 2005-119042

(51) Int. Cl.
*G01K 7/00* (2006.01)
(52) U.S. Cl. ........................................ 374/178; 327/512
(58) Field of Classification Search .................. 374/178
See application file for complete search history.

(56) References Cited

U.S. PATENT DOCUMENTS

| | | | |
|---|---|---|---|
| 5,070,322 A | 12/1991 | Fujihira | 340/653 |
| 5,349,336 A | 9/1994 | Nishiura et al. | 340/653 |
| 5,355,123 A | 10/1994 | Nishiura et al. | 340/653 |
| 5,440,520 A * | 8/1995 | Schutz et al. | 365/226 |
| 5,546,041 A * | 8/1996 | Szajda | 327/512 |
| 5,557,550 A * | 9/1996 | Vigil et al. | 702/130 |
| 5,736,769 A | 4/1998 | Nishiura et al. | 257/368 |
| 6,149,299 A | 11/2000 | Aslan et al. | 374/178 |
| 6,567,763 B1 * | 5/2003 | Javanifard et al. | 702/130 |
| 6,808,307 B1 * | 10/2004 | Aslan et al. | 374/178 |
| 6,876,250 B2 * | 4/2005 | Hsu et al. | 327/539 |
| 7,082,377 B1 * | 7/2006 | Aslan et al. | 702/130 |
| 7,089,146 B1 * | 8/2006 | D'Aquino et al. | 702/132 |
| 7,341,374 B2 * | 3/2008 | Chiu | 374/1 |
| 2005/0220171 A1 * | 10/2005 | Faour et al. | 374/178 |
| 2006/0203883 A1 * | 9/2006 | Griffin | 374/178 |
| 2008/0144700 A1 * | 6/2008 | Schnaitter | 374/178 |
| 2008/0151966 A1 * | 6/2008 | Clark et al. | 374/178 |

FOREIGN PATENT DOCUMENTS

JP 64-063828 3/1989

* cited by examiner

*Primary Examiner*—Gail Verbitsky
*Assistant Examiner*—Mirellys Jagan
(74) *Attorney, Agent, or Firm*—Rabin & Berdo, PC

(57) ABSTRACT

A temperature measurement device of a power semiconductor device includes a plurality of temperature detecting diodes formed on a first chip having a power semiconductor device; and a detection circuit that is formed on a second chip having an integrated circuit that controls the power semiconductor device and is connected to the temperature detecting diodes; wherein the detection circuit detects a temperature of the power semiconductor device based on a difference between the forward voltages of the temperature detecting diodes when different values of current flow to the respective temperature detecting diodes.

10 Claims, 19 Drawing Sheets

TEMPERATURE MEASUREMENT DEVICE OF POWER SEMICONDUCTOR DEVICE

CROSS-REFERENCE TO RELATED APPLICATIONS

This application claims the benefit of priority of Japanese patent application number JP 2005-119042, filed Apr. 15, 2005, the entire disclosure of which is incorporated herein by reference.

BACKGROUND OF THE INVENTION

1. Field of the Invention

The invention relates to a temperature measurement device for a power semiconductor device.

2. Description of the Related Art

In general, in a power converter that uses a power semiconductor device such as an IGBT (Insulated Gate Bipolar Transistor), a power semiconductor device and an integrated circuit (IC) that drives and protects the power semiconductor device are formed on different chips. This is because the manufacturing cost of forming them on different chips is lower than the cost of forming them on the same chip.

Furthermore, such power converters are necessarily provided with a device for measuring a temperature of the power semiconductor device, since the temperature of the power semiconductor device has to be detected to protect the power semiconductor device from overheating. Since, as mentioned above, the power semiconductor device and the integrated circuit are constituted on separate chips, as shown in FIG. 20, a temperature sensor 1 is disposed on a chip 2 of the power semiconductor device, whereas a detection circuit 3 for controlling the temperature sensor 1 and processing an output signal is disposed on a chip 4 of the integrated circuit.

One type of temperature sensor is known from JP-A-3-148861 (corresponding to U.S. Pat. No. 5,070,322) in which a diode (hereinafter referred to as a diffusion diode) is formed by means of diffusion on a surface of a silicon substrate of a power semiconductor device, and the temperature dependency of a reverse leakage current of the diode is utilized.

Furthermore, a type of temperature sensor that makes use of the temperature dependency of a forward voltage of a diffusion diode is also known in the art. See JP-A-5-129598 (corresponding to U.S. Pat. Nos. 5,355,123 and 5,349,336) and JP-A-8-316471 (corresponding to U.S. Pat. No. 5,736,769). In a temperature sensor according to these configurations, since a PN junction is stably formed in a single crystal substrate of silicon, in comparison with a diode formed from polysilicon, the linearity of the temperature dependency of the forward voltage is excellent.

However, in a temperature measurement device that uses an existing diffusion diode as a temperature sensor, when a diffusion diode is formed on a silicon substrate of a power semiconductor device and a forward voltage of the diffusion diode is utilized per se, sufficiently high temperature detection accuracy can be obtained only with difficulty. The reason why is that current flowing to the diffusion diode fluctuates and a PN junction of the diffusion diode is manufactured with dispersion.

In addition to the above, since a temperature sensor and a detection circuit are disposed on separate chips, there is no correlation between the fluctuation of the temperature sensor and the dispersion of the detection circuit. Accordingly, in a temperature measurement device in which these are combined, the respective dispersions are effectively added. In this configuration, a detection voltage of the detection circuit is controlled in accordance with a forward voltage of the IGBT to reduce the dispersion of the temperature measurement device. However, as adjustment is troublesome and time consuming, there is a problem in that this leads to increased cost.

Furthermore, when an IGBT is turned off, holes (positive carriers) piled up in an N-type substrate that becomes a drift region when the IGBT is turned on, though drawn by an emitter, leak into the diffusion diode. Thereby, a parasitic thyristor operates made of an NPN transistor constituted of an N-type region of the diffusion diode, a P-well of the diffusion diode and an N-type substrate and a PNP transistor constituted of a P-well of the diffusion diode, the N-type substrate and a P-type region that becomes a collector region of the IGBT. Accordingly, there is a problem in that the diffusion diode may be damaged. Alternatively, there is a problem in that a parasitic current flows in the diffusion diode and thereby the detection circuit connected to the diffusion diode may be damaged.

Still further, in order to always supervise a temperature of a power semiconductor device to optimally control the semiconductor device, the necessity arises of constantly outputting from the temperature measurement device a voltage proportionate to the temperature of the power semiconductor device. However, in between when the IGBT is in an ON-state and when it is in an OFF-state, a current flowing from an anode of the diffusion diode varies. Accordingly, it is difficult to constantly obtain a forward voltage proportionate to the temperature.

The reason why, when a constant current flows to the anode of the diffusion diode, the current flowing in the diffusion diode varies depending on a state of the IGBT, is as follows. When the IGBT is turned on, a potential of a region in the proximity of the diffusion diode of the N-type substrate is reduced, and thereby a junction of a P-well of the diffusion diode and the N-type substrate is forward biased. Accordingly, a current flowing from the anode of the diffusion diode to a cathode thereof partially leaks and flows through the P-well of the diffusion diode and the N-type substrate to an emitter of the IGBT. Conversely, when the IGBT is turned off, the junction of the P-well of the diffusion diode and the N-type substrate is reverse biased. Accordingly, the current flowing in the diffusion diode does not leak toward the IGBT.

SUMMARY OF THE INVENTION

In order to overcome the problems of the existing technologies, it is an object of the invention to provide a temperature measurement device of a power semiconductor device, which can detect the temperature of the power semiconductor device with high precision by performing an adjustment operation less frequently or not at all. Furthermore, it is another object of the invention to provide a temperature measurement device of a power semiconductor device, which can inhibit a temperature sensor and a detection circuit from being damaged. Still further, it is yet another object of the invention to provide a temperature measurement device of a power semiconductor device, which can constantly obtain a voltage proportionate to the temperature of the power semiconductor device.

In order to overcome the above problems and thereby to achieve the objects, according to a first aspect of the invention, a temperature measurement device of a power semiconductor device includes a plurality of temperature detecting diodes formed on a first chip having a power semiconductor device, and a detection circuit formed on a second chip having an integrated circuit that controls the power semiconductor device and which is connected to the temperature detecting diodes, the detection circuit detecting a temperature of the power semiconductor device based on voltage difference in a forward direction between the temperature detecting diodes when currents different in value are flowing in the respective temperature detecting diodes.

It is preferable that, in the invention according to the first aspect of the invention, each of the temperature detecting diodes is connected to the detection circuit at an impedance of 1 Ω or more both on an anode side and a cathode side thereof and at an impedance higher on the cathode side than the anode side.

It is preferable that, in the invention according to the first aspect of the invention, forward voltages different in magnitude, which are outputted from the respective temperature detecting diodes, are inputted to a differential amplifier to amplify the voltage differences between the temperature detecting diodes with the differential amplifier.

It is preferable that, in the invention according to the first aspect of the invention, forward voltages different in magnitude, which are outputted from the respective temperature detecting diodes, are inputted to the differential amplifier through separate buffer amplifiers, each having the same configuration as the differential amplifier.

It is preferable that, in the invention according to the first aspect of the invention, cathodes of the respective temperature detecting diodes are independently connected to the detection circuit and anodes of the respective temperature detecting diodes are connected to the detection circuit in common.

It is preferable that, in the invention according to the first aspect of the invention, the anodes of the respective temperature detecting diodes are connected to a current limiter.

It is preferable that, in the invention according to the first aspect of the invention, the current limiter is a constant current source.

It is preferable that, in the invention according to the first aspect of the invention, the anodes of the respective temperature detecting diodes are connected to a constant voltage source.

It is preferable that, in the invention according to the first aspect of the invention, the temperature detecting diodes are symmetrically arranged in an in-plane layout.

It is preferable that, in the invention according to the first aspect of the invention, an external periphery of each of the temperature detecting diodes is surrounded by a P-type semiconductor region to which a potential the same as a reference potential of the power semiconductor device is applied and an anode region of each of the temperature detecting diodes is 100 μm or more apart from an end of the power semiconductor device side of the P-type semiconductor region.

It is preferable that, in the invention according to the first aspect of the invention, an external periphery of each of the temperature detecting diodes is surrounded by a P-type semiconductor region to which a potential the same as a reference potential of the power semiconductor device is applied, an N-type semiconductor region is interposed between the P-type semiconductor region and an anode region of each of the temperature detecting diodes, and the withstand voltage between the anode region and the P-type semiconductor region is larger than an input voltage to the anode region.

It is preferable that, in the invention according to the first aspect of the invention, an external periphery of each of the temperature detecting diodes is surrounded by a P-type semiconductor region to which a potential the same as a reference potential of the power semiconductor device is applied, and the P-type semiconductor region and an anode region of each of the temperature detecting diodes are 1 μm or more apart with an N-type semiconductor region interposed therebetween.

It is preferable that, in the invention according to the first aspect of the invention, an external periphery of each of the temperature detecting diodes is surrounded with a dielectric material.

According to a second aspect of the invention, a temperature measurement device of a power semiconductor device includes a temperature detecting diode formed on a first chip having a power semiconductor device and a detection circuit formed on a second chip having an integrated circuit that controls the power semiconductor device and connected to the temperature detecting diode, the detection circuit detecting a temperature of the power semiconductor device based on voltage difference in a forward direction of the temperature detecting diode when different currents flow in a time-sharing manner to the temperature detecting diode.

It is preferable that, in the invention according to the second aspect of the invention, the temperature detecting diode is connected to the detection circuit at an impedance of 1 Ω or more both on an anode side and on a cathode side thereof and at an impedance higher on the cathode side than on the anode side.

It is preferable that, in the invention according to the second aspect of the invention, forward voltages different in magnitude, which are outputted in a time-sharing manner from the temperature detecting diode, are inputted in a differential amplifier to amplify the voltage differences of the temperature detecting diodes with the differential amplifier.

It is preferable that, in the invention according to the second aspect of the invention, an output from the temperature detecting diode is inputted through a buffer amplifier to the differential amplifier.

It is preferable that, in the invention according to the second aspect of the invention, an anode of the temperature detecting diode is connected to a current limiter.

It is preferable that, in the invention according to the second aspect of the invention, the current limiter is a constant current source.

It is preferable that, in the invention according to the second aspect of the invention, an anode of the temperature detecting diode is connected to a constant voltage source.

It is preferable that, in the invention according to the second aspect of the invention, an external periphery of the temperature detecting diode is surrounded by a P-type semiconductor region to which a potential the same as a reference potential of the power semiconductor device is applied, and an anode of the temperature detecting diode is 100 μm or more apart from an end on the power semiconductor device side of the P-type semiconductor region.

It is preferable that, in the invention according to the second aspect of the invention, an external periphery of the temperature detecting diode is surrounded by a P-type semiconductor region to which a potential the same as a reference potential of the power semiconductor device is applied, an N-type semiconductor region is interposed between the P-type semiconductor region and an anode region of the temperature detecting diode, and the withstand voltage between the anode region and the P-type semiconductor region is larger than an input voltage to the anode region.

It is preferable that, in the invention according to the second aspect of the invention, an external periphery of the temperature detecting diode is surrounded by a P-type semi-conductor region to which a potential the same as a reference potential of the power semiconductor device is applied, and the P-type semiconductor region and an anode region of the temperature detecting diode are 1 μm or more apart with an N-type semiconductor region interposed therebetween.

It is preferable that, in the invention according to the second aspect of the invention, an external periphery of the temperature detecting diode is surrounded with a dielectric material.

According to the invention, since a forward voltage difference proportionate to a temperature of a chip of a power semiconductor device can be obtained with high precision, even with less frequent adjustment operations or without performing any adjustment operations, the temperature of a power semiconductor device can be detected with high precision. Furthermore, since latch-up due to the operation of a parasitic thyristor can be inhibited from occurring, the temperature sensor and the detection circuit can be protected from being damaged. Still furthermore, a forward voltage difference proportionate to a temperature of the chip of the power semiconductor device can be continuously obtained.

According to the temperature measurement device of the power semiconductor device according to the invention, a temperature of the power semiconductor device can be obtained at high precision with less frequent or no adjustment operations. Furthermore, the temperature sensor and the detection circuit can be protected from being damaged. Still furthermore, a voltage proportionate to the temperature of the power semiconductor device can be continuously obtained.

DESCRIPTION OF THE PREFERRED EMBODIMENTS

In what follows, with reference to the accompanying drawings, preferred embodiments of a temperature measurement device of a power semiconductor device according to the invention will be described in detail. In the specification and in the accompanying drawings, in a layer or a region bearing an N or P sign, electrons or positive holes are majority carriers, respectively. Furthermore, a + sign attached to N or P means that a layer or a region attached with a + sign have a higher impurity concentration than a layer or a region without a + sign.

Embodiment 1

Figure 1:
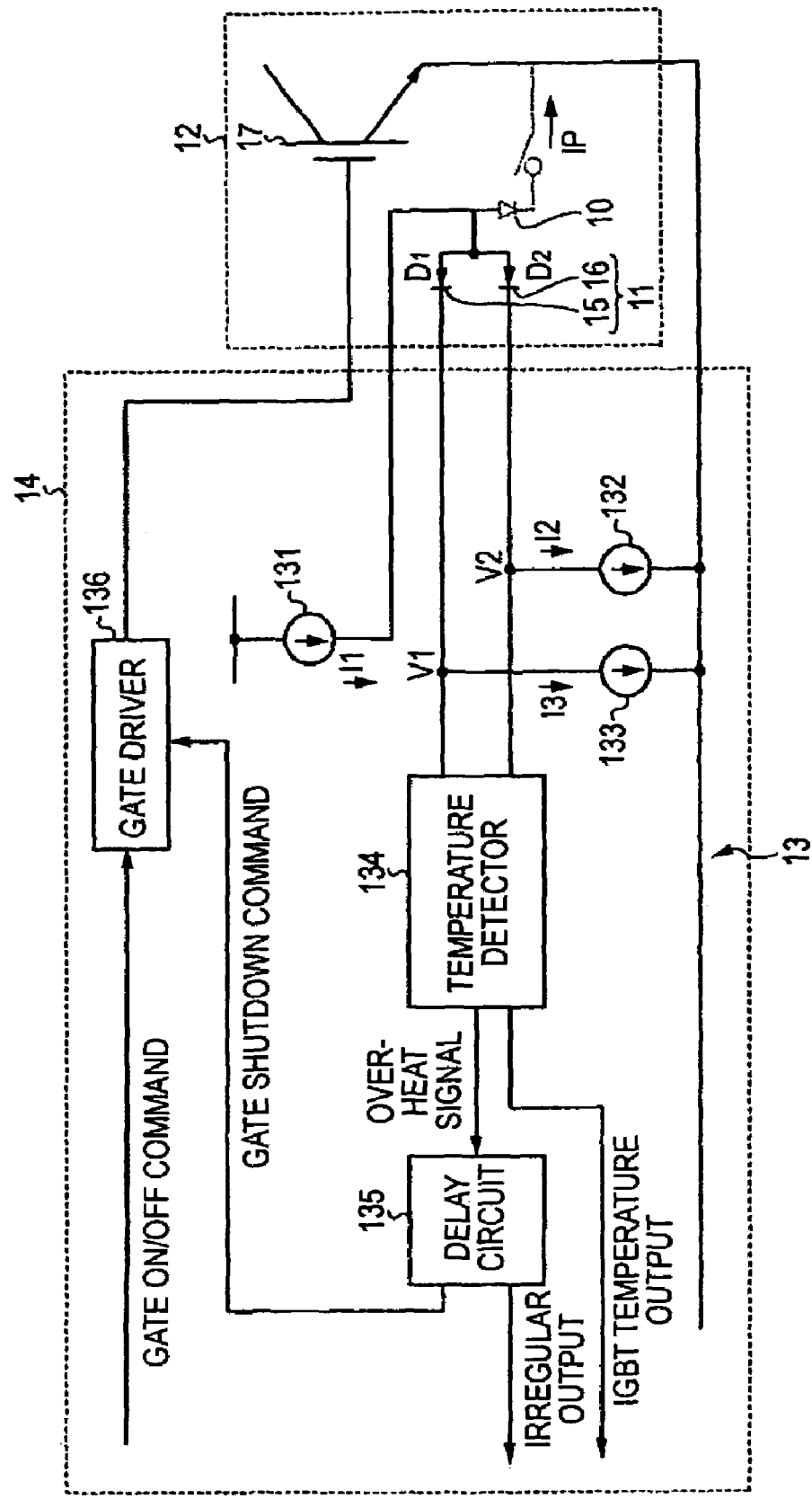
FIG. 1 is an equivalent circuit diagram showing a schematic configuration of a temperature measurement device according to embodiment 1.

FIG. 1 is an equivalent circuit diagram showing a schematic configuration of a temperature measurement device according to an embodiment 1 of the invention. As shown in FIG. 1, a temperature sensor 11 is disposed on a chip 12 having a power semiconductor device 17. A detection circuit 13 that controls the temperature sensor 11 and processes an output signal thereof is disposed on a chip 14. The temperature sensor 11 is constituted of a pair of diodes 15 and 16 disposed adjacent to each other. Anodes of the diodes 15 and 16 are commonly connected to a first constant current source 131 of the detection circuit 13 at an impedance of, for instance, 1 Ω or more. The first constant current source 131 drives a current I1 toward the anodes of the diodes 15 and 16.

Furthermore, a cathode of the second diode 16 and a cathode of the first diode 15, respectively, are connected to a second constant current source 132 and a third constant current source 133 of the detection circuit 13. Still further, the cathode of the first diode 15 and the cathode of the second diode 16 are connected to a temperature detector 134 of the detection circuit 13. An impedance on a cathode side of the first diode 15 and an impedance on a cathode side of the second diode 16, though different from each other, are both 1 Ω or more and higher than an impedance on an anode side.

Accordingly, a current I3 that flows on a cathode side of the first diode 15 and a current I2 that flows on a cathode side of the second diode 16 are different in value, and therefore a forward voltage V1 of the first diode 15 and a forward voltage V2 of the second diode 16 are different. When a ratio of the currents I2 and I3 is set to be an integer, the ratio can be preferably obtained with precision in a chip 14 of the integrated circuit. The temperature detector 134 detects a temperature of the chip 12 of the power semiconductor device based on a difference (V2–V1) of the forward voltages V1 and V2 of the diodes 15 and 16 and outputs this value externally.

The reason why the impedances on the cathode sides of the diodes 15 and 16 are higher than the impedances on the anode sides is to inhibit positive holes from flowing in the cathodes of the diodes 15 and 16. In other words, the impedances on the anode sides of the diodes 15 and 16 are lower than that on the cathode sides. This is because toward the anodes of the diodes 15 and 16, in addition to the current (I2+I3) flowing toward the cathodes of the diodes 15 and 16, a parasitic diode 10 has to supply a parasitic current IP to a power semiconductor device such as an emitter of an IGBT 17 from the anode side. That is, since it is necessary for I1 to be larger than (I2+I3+IP), the impedance on the anode side is lower.

Furthermore, the temperature detector 134 outputs an overheat signal when a detected temperature exceeds a predetermined temperature. When a delay circuit 135 associated with the detection circuit 13 receives the overheat signal from the temperature detector 134, an irregular output is performed and a gate shutdown command is outputted. When gate driver 136 receives the gate shutdown command from the delay circuit 135, it forcibly turns off the power semiconductor device of the chip 12 of the power semiconductor device, for instance, the IGBT 17. Furthermore, the gate driver 136 receives a gate ON/OFF command externally to control ON/OFF switching of, the IGBT 17, for example.

It is known that an equation (1) below holds between a current I flowing to a diode and a forward voltage V. Here, diode saturation current is denoted Is and absolute junction temperature is denoted T. Is proportionate to the area of the junction. Furthermore, the Boltzmann constant is denoted k and the amount of electric charge of an electron is denoted q.

$$I = Is\{\exp(qV/kT) - 1\} \qquad (1)$$

For a pair of diodes (PN junction) adjacently formed on the same substrate, a junction area, a current, a saturation current and a forward voltage of a first diode, respectively, are expressed with Sa, Ia, Isa and Va and a junction area, a current, a saturation current and a forward voltage of a second diode, respectively, are expressed with Sb, Ib, Isb and Vb. In the pair of diodes, an area ratio of junction m and a current ratio K, respectively, can be expressed with equations (2) and (3) below. Furthermore, when a potential difference (Vb−Va) of the pair of diodes is expressed with ΔV, the potential difference ΔV is known expressed with an equation (4) below.

$$m = S2/S1 = Isb/Isa \qquad (2)$$

$$K = Ib/Ia \qquad (3)$$

and $$\Delta V = (kT/q) \times \ln(K/m) \qquad (4)$$

As can be understood from equation (4), the potential difference ΔV is proportional to an absolute temperature T and has no relation with an absolute value of a current and a magnitude of a junction. When diodes are arranged symmetrically, the precision of a ratio of junction areas can be increased. Furthermore, when a current mirror circuit is used, the precision of the current ratio can be heightened. Accordingly, according to the configuration shown in FIG. 1, a voltage (potential difference ΔV) proportional to an absolute temperature T can be obtained with high precision.

Figure 2:
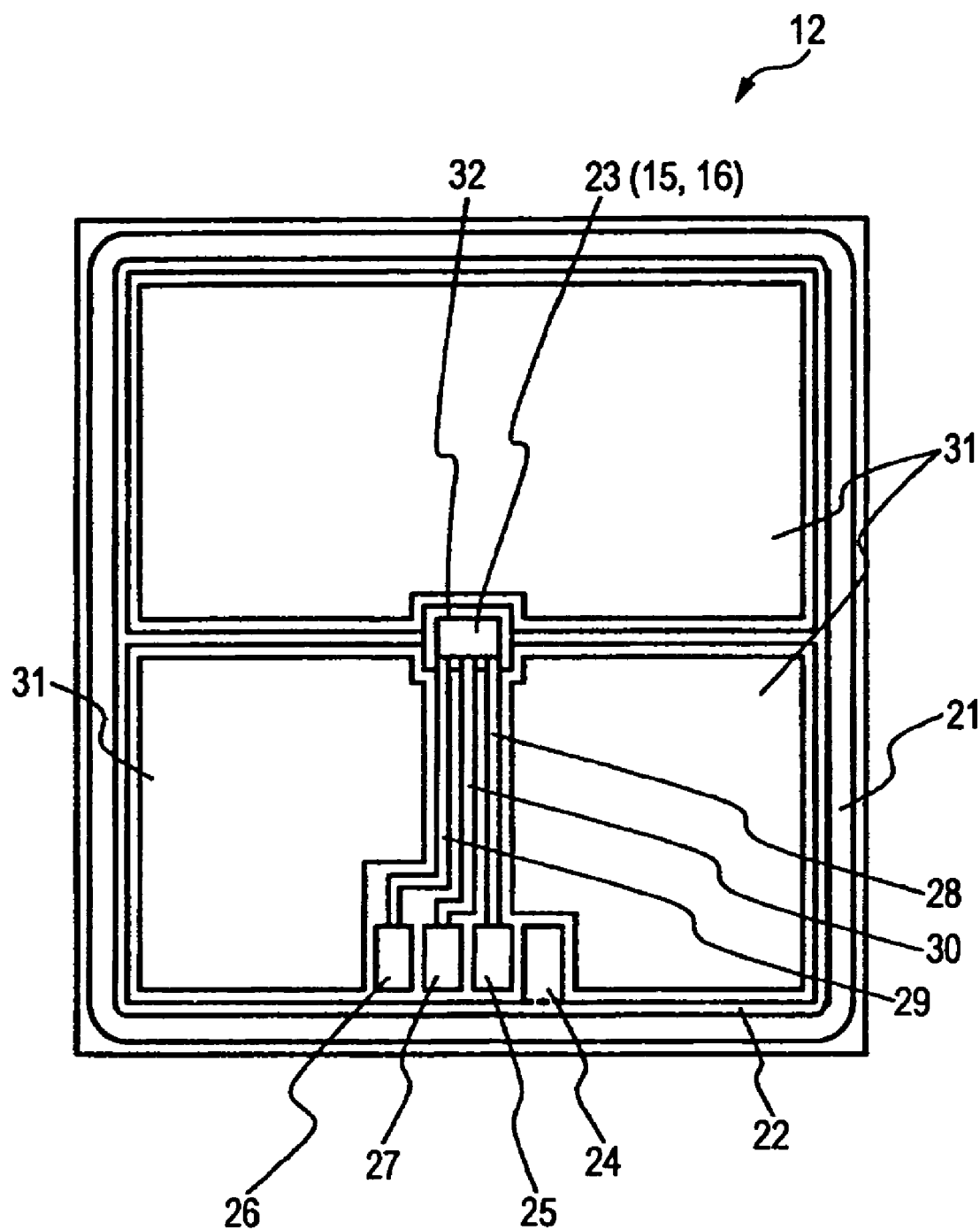
FIG. 2 is a plan layout diagram showing an IGBT chip according to embodiment 1.

A device structure in the chip 12 of the power semiconductor device will be described next in a case where the power semiconductor device is an IGBT as an example. FIG. 2 is a plan layout diagram showing an example of the chip (hereinafter referred to as IGBT chip) 12 of the power semiconductor device. As shown in FIG. 2, a voltage withstanding structure 21 is disposed along, for instance, a peripheral border of the IGBT chip 12. Along the voltage withstanding structure 21 and inside thereof, a gate runner 22 is disposed. At a center of the IGBT chip 12, a region (hereinafter referred to as diode region) 23 is provided where a pair of temperature detecting diodes 15 and 16 are formed.

Along a side of the IGBT chip 12 and inside of the gate runner 22, agate pad 24, a first cathode pad 25, a second cathode pad 26 and an anode pad 27 are disposed. As mentioned above, since the anodes of the pair of temperature detecting diodes 15 and 16 are connected in common to the detection circuit 13, one anode pad 27 suffices as their anode pad. Accordingly, in comparison with the case where two anode pads are provided, the number of pads on the IGBT chip 12 can be reduced. The gate pad 24 is connected through the gate runner 22 to a gate electrode of the IGBT. Furthermore, the gate pad 24 is connected through a wire electrode to an IGBT driving circuit of the chip 14 of the integrated circuit.

The first cathode pad 25, the second cathode pad 26 and the anode pad 27, respectively, are connected through a first cathode interconnection 28, a second cathode interconnection 29 and an anode interconnection 30 to cathode electrodes and an anode electrode of the diodes 15 and 16. Then, the first cathode pad 25, the second cathode pad 26 and the anode pad 27, respectively, are connected through the wire electrode to the detection circuit 13 of the chip 14 of the integrated circuit. Between the gate runner 22 and the diode region 23 is a region 31 where an emitter electrode of the IGBT is formed and a region where the IGBT is formed. A diverter region 32 will be discussed below in reference to FIG. 3.

Figure 3:
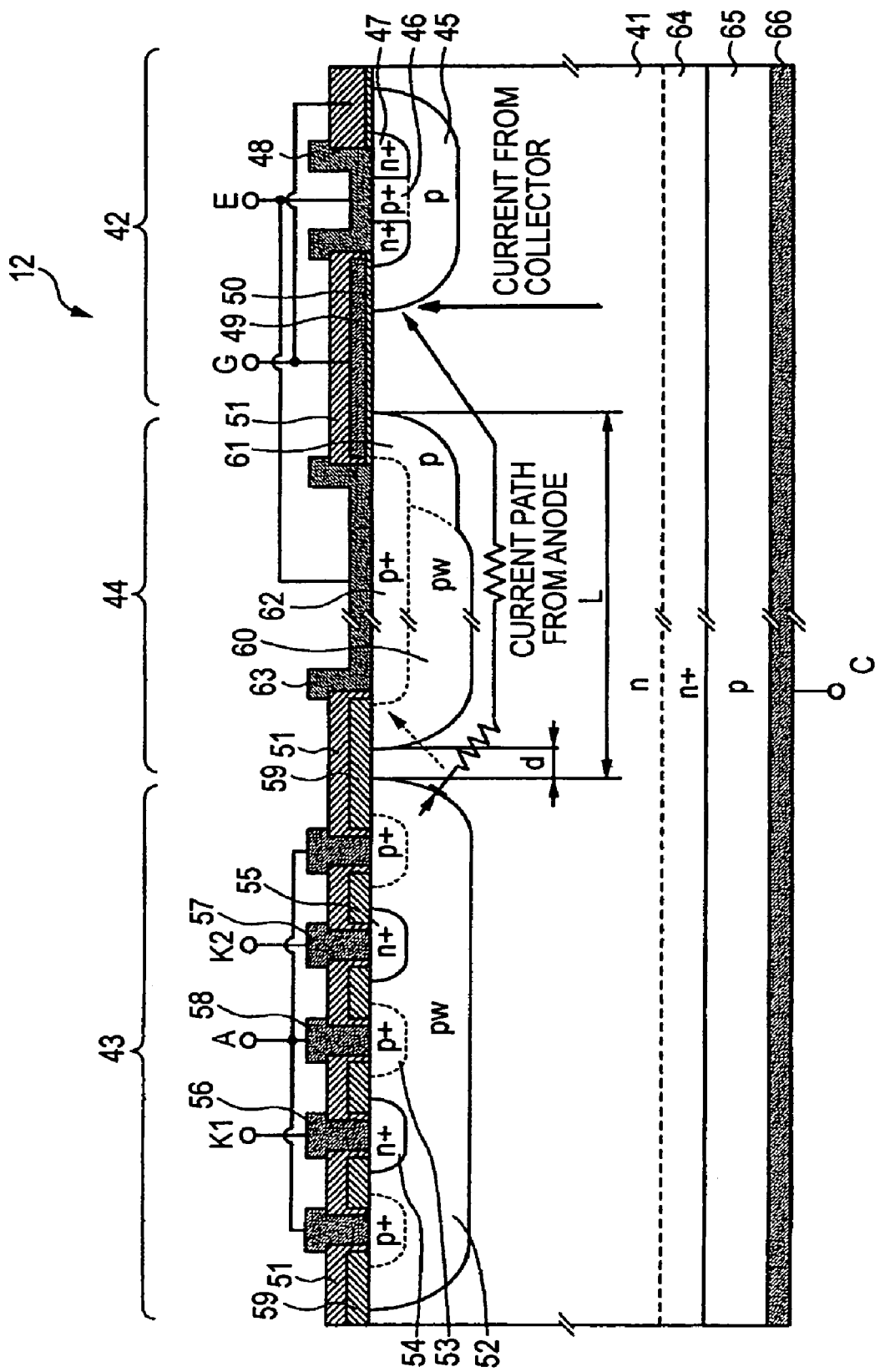
FIG. 3 is a sectional view showing an example of an IGBT chip according to embodiment 1.
Figure 4:
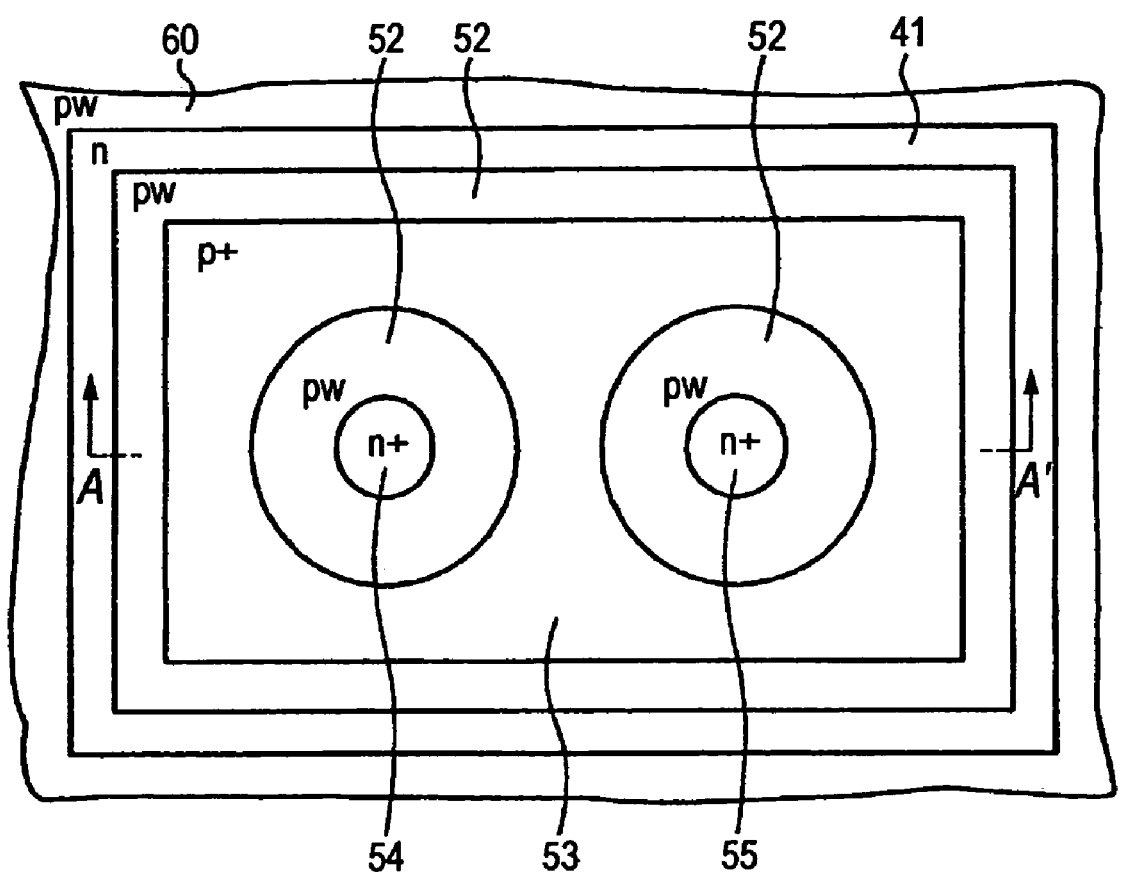
FIG. 4 is a plan view showing an example of a temperature detecting diode portion of embodiment 1.
Figure 5:
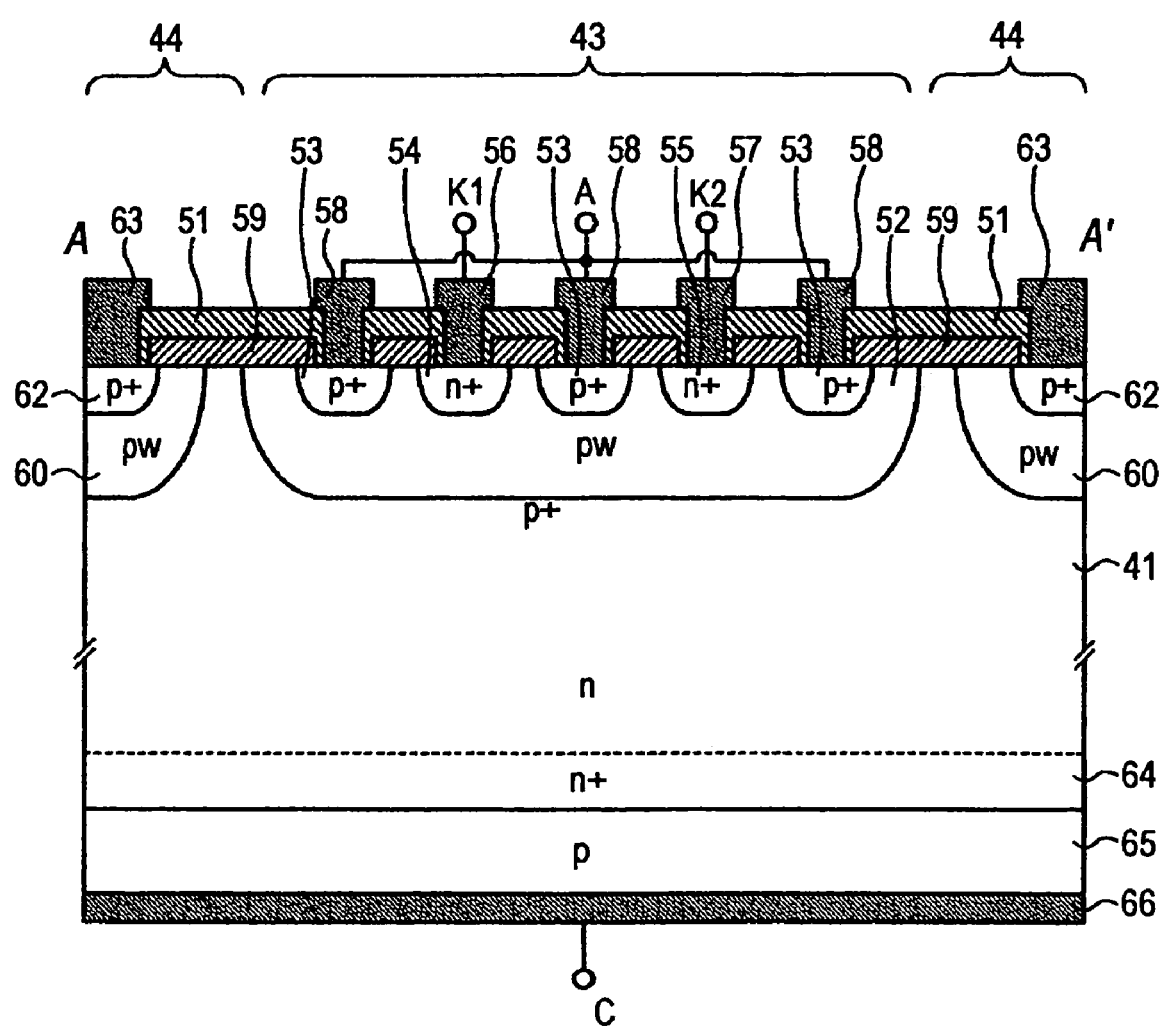
FIG. 5 is a sectional view showing a configuration in a cross-section A-A' of FIG. 4.

FIG. 3 is a sectional view showing an example of a configuration of an essential portion of the IGBT chip 12. Furthermore, in FIG. 4, a configuration of a semiconductor surface of a temperature detecting diode portion of FIG. 3 is shown and a cross-section A-A' of FIG. 4 is shown in FIG. 5. In FIGS. 3 and 5, a passivation film is omitted (also in FIGS. 6, 9, 11 and 12). Furthermore, in FIG. 4, an interlayer insulating film, an electrode and a passivation film on a chip surface are omitted (as in FIGS. 7, 8, 10, 14 and 15).

As shown in FIG. 3, on a first main surface side of an N-type silicon layer (hereinafter referred to as N-layer) 41, a gate portion and an emitter portion (hereinafter referred to as IGBT active portion) 42 of the IGBT and a temperature detecting diode portion 43 are formed. Between the IGBT active portion 42 and the temperature detecting diode portion 43, a diverter portion 44 is formed. An external periphery of the temperature detecting diode portion 43 is surrounded with the diverter portion 44. The diverter portion 44 is formed in the diverter region shown with reference numeral 32 in FIG. 2.

In the IGBT active portion 42, inside of a first P-diffusion region 45 formed on a surface of the N-layer 41, a first $P^+$-diffusion region 46 and a first $N^+$-diffusion region 47 are formed. An emitter electrode 48 made of Al—Si is in contact with the first $P^+$-diffusion region 46 and the first $N^+$-diffusion region 47. A gate electrode 49 made of polysilicon is provided through a gate oxide film 50 on a surface between the first $P^+$-diffusion region 46 and the N-layer 41 of the first P-diffusion region 45. The emitter electrode 48 and the gate electrode 49 are insulated with an insulating film 51 made of BPSG (Boro-Phospho-Silicate Glass).

As shown in FIGS. 3 and 5, in the temperature detecting diode portion 43, on a surface of the N-layer 41, a first P-well 52 is formed that is an anode region, and on a surface thereof a second $P^+$-diffusion region 53, a second $N^+$-diffusion region 54 and a third $N^+$-diffusion region 55 respectively are formed that become cathode regions. The second $N^+$-diffusion region 54 and the third $N^+$-diffusion region 55 are independent from each other.

As shown in FIG. 4, on a semiconductor surface of the temperature detecting diode portion 43, a first P-well 52 is circularly exposed, and inside thereof the second $P^+$-diffusion region 53 is exposed. Inside of the second $P^+$-diffusion region 53, once more a circular first P-well 52 is exposed at two places. Of the two first P-wells 52 exposed inside, at a center portion of one, the second N$^+$-diffusion region 54 is exposed, and at a center portion of the other the third N$^+$-diffusion region 55 is exposed. The second N$^+$-diffusion region 54 and the third N$^+$-diffusion region 55 are symmetrically provided in the temperature detecting diode portion 43.

As shown in FIG. 5, a first cathode electrode 56 is in contact with the second N$^+$-diffusion region 54 and in contact electrically with the first cathode interconnection 28 shown in FIG. 2. A second cathode electrode 57 is in contact with the third N$^+$-diffusion region 55 and in contact electrically with the second cathode interconnection 29 shown in FIG. 2. An anode electrode 58 is in contact with the second P$^+$-diffusion region 53 and in contact electrically with the anode interconnection 30 shown in FIG. 2. The first cathode electrode 56, the second cathode electrode 57 and the anode electrode 58 are made of an electric conductor such as Al—Si and insulated from each other with an insulating film 59 made of SiO$_2$ and an insulating film 51 made of BPSG.

As shown in FIG. 3, in the diverter 44, a second P-well 60 is continuously formed on a temperature detecting diode portion 43 side of a surface of the N-layer 41 and a second P-diffusion region 61 is continuously formed on an IGBT active portion 42 side thereof. Inside of the second P-well 60 and the second P-diffusion region 61, a third P$^+$-diffusion region 62 is formed. An electrode 63 made of Al—Si is in contact with the third P$^+$-diffusion region 62.

When the IGBT active portion 42 is in an ON-state, since a channel of the P-diffusion region 45 is inverted to an N-type and turned on, a current flows from the anode toward an emitter from the P$^+$-diffusion region 53 through the N-layer 41. At that time, the vicinity of the diverter portion 44 becomes a potential obtained by subtracting a forward voltages of P-well 52 and the N-layer 41 from an anode potential. At this time, when the withstand voltages of the N-layer 41 and the P-well 60 is lower than a potential obtained by subtracting the forward voltages of P-well 52 and the N-layer 41 from the anode potential, a current flows from the anode to the diverter, as shown by the dashed line with the arrow.

Since the path of the dashed line with the arrow is lower in resistance than a path between the anode and the emitter, anode current tends to increase. An increase in the anode current unfavorably increases a consumption current supplied from a control IC. Furthermore, since the anode current increases exponentially with respect to voltage, an anode terminal may be damaged. Accordingly, the withstand voltage between the anode region and the P-type semiconductor region is effectively made larger than an input voltage to the anode region.

An electrode 63 of the diverter portion 44 is short-circuited to an emitter electrode 48 of the IGBT active portion 42. That is, the second P-well 60, second P-diffusion region 61 and third P$^+$-diffusion region 62 of the diverter portion 44 have a potential the same as the emitter potential (reference potential) of the IGBT. The electrode 63 of the diverter portion 44 is insulated from the gate electrode 49 by the insulating film 51 and from the cathode electrodes 56 and 57 and the anode electrode 58 of the temperature detecting diode portion 43 by the insulating films 51 and 59.

On a second main surface side of the N-layer 41, sequentially from the N-layer 41 side, an N$^+$-diffusion region 64 that becomes a buffer layer and a P-diffusion region 65 that becomes a collector region are formed. On a surface of the P-diffusion region 65, a collector electrode 66 is formed.

Now, as shown in FIG. 3, when a distance from an end on the IGBT side of the second P-diffusion region 61 of the diverter portion 44 to an end on the diverter side of the first P-well 52 of the temperature detecting diode portion 43 is taken as L, L is preferably 100 µm or more. Furthermore, when a distance from an end on the temperature detecting diode side of the second P-well 60 of the diverter portion 44 to an end on the diverter side of the first P-well 52 of the temperature detecting diode portion 43 is taken as d, d is preferably 1 µm or more. Reasons for this will be described with reference to FIG. 6.

Figure 6:
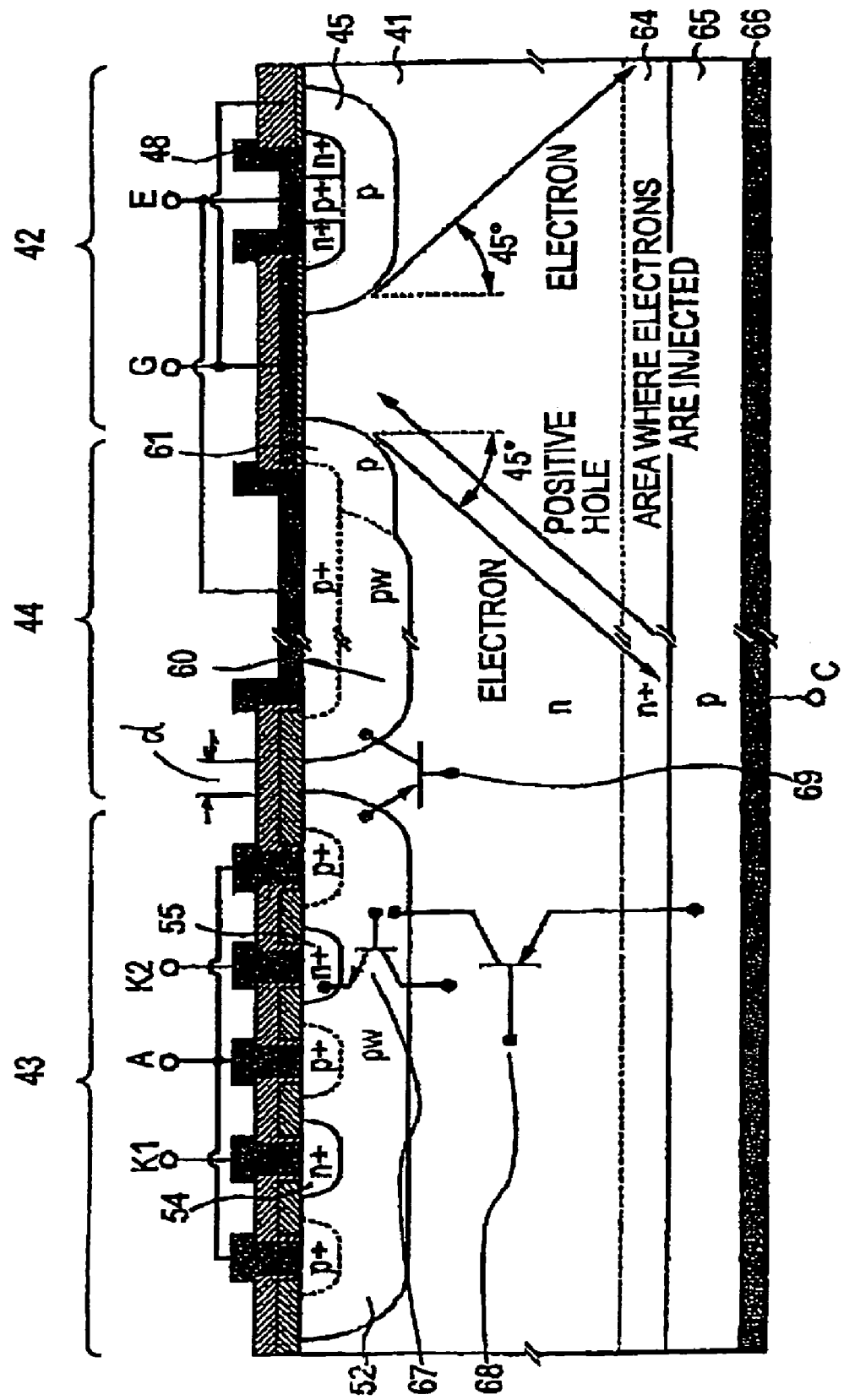
FIG. 6 is a sectional view explaining a parasitic element of an IGBT chip.

As shown in FIG. 6, in the temperature detecting diode portion 43, a thyristor made of a parasitic NPN-transistor 67 is present where the N$^+$-diffusion regions 54 and 55 and the first P-well 52 of the temperature detecting diode portion 43, respectively, are an emitter and a base and the N-layer 41 is a collector, and a parasitic PNP-transistor 68 is present where the P-diffusion region 65 that becomes a collector region, the N-layer 41 and the first P-well 52 of the temperature detecting diode portion 43, respectively, are an emitter, a base and a collector.

When the parasitic PNP-transistor 68 is energized, the parasitic thyristor is energized, and thereby latch-up causes a large current to flow. In order to inhibit the parasitic PNP-transistor 68 from being energized, in the temperature detecting diode portion 43, positive holes may be inhibited from being injected from the collector electrode 66 to the N-layer 41. The positive holes are injected at a place where, when the IGBT is in ON-state, electrons injected from the emitter electrode 48 reach an N$^+$-diffusion region 64 between the N-layer 41 and the P-diffusion region 65.

Accordingly, to an extent where in the IGBT active portion 42 electrons injected from the emitter electrode 48 do not reach a portion below the temperature detecting diode portion 43 of the N$^+$-diffusion region 64, the temperature detecting diode portion 43 may well be distanced from the IGBT active portion 42. A region where when the IGBT is ON-state electrons are injected from the emitter electrode 48 is a portion of the N-layer 41 between the first P-diffusion region 45 of the IGBT active portion 42 and the second P-diffusion region 61 of the diverter portion 44.

In general, electrons, while spreading at an angle of substantially 45°, move toward the collector electrode 66. Accordingly, where L is the thickness of the substrate, electrons do not reach a portion below the temperature detecting diode portion 43. Since the thickness of the substrate is substantially 50 µm when the IGBT is, for instance, a 600 V element and substantially 100 µm when the IGBT is, for instance, 1200 V element, when L is 100 µm or more, latch-up due to the operation of the parasitic thyristor can be inhibited from occurring. L, without being restricting to 100 µm or more, may well be a distance equal to or more than a diffusion length of the minority carriers.

Furthermore, as shown in FIG. 6, there is a parasitic PNP transistor 69 where the first P-well 52 and the N-layer 41 of the temperature detecting diode portion 43 and the second P-well 60 of the diverter portion 44, respectively, are an emitter, a base and a collector. When the parasitic PNP transistor 69 is energized, an anode voltage is unfavorably lowered in the temperature detecting diode portion 43. When d is set to 1 µm or more, the parasitic PNP transistor 69 can be inhibited from being energized. The distance d, without being restricting to 1 µm or more, may well be a distance to an extent where a depleted layer cannot be reached under a potential applied on a diode of the temperature detecting diode portion 43. Though not clearly shown in FIG. 6, owing to the junction of the first P-well 52 and the N-layer 41 of the temperature detecting diode portion 43, a parasitic diode (parasitic diode 10 in FIG. 1) is constituted.

Figure 7:
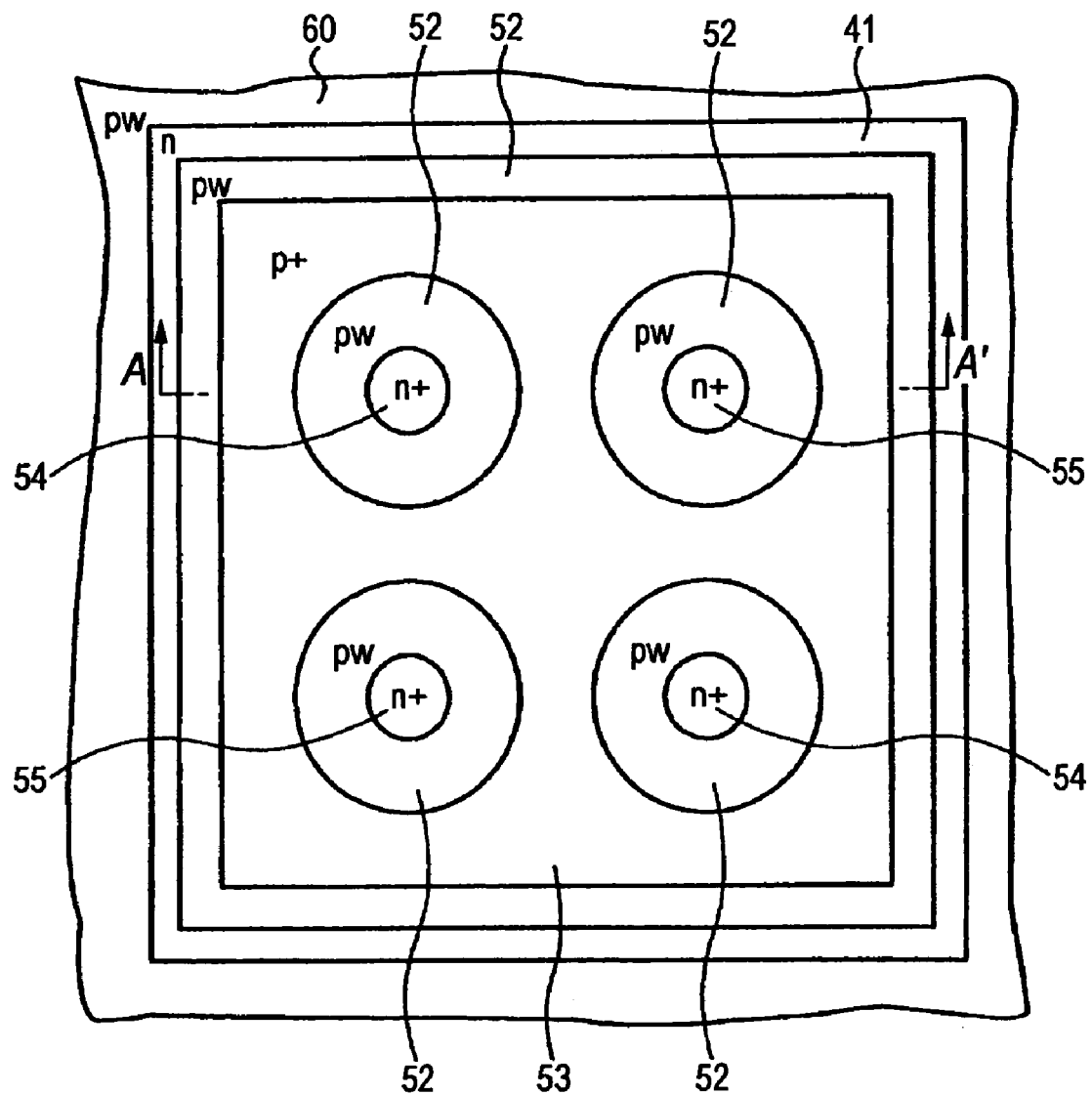
FIG. 7 is a plan view showing another example of a temperature detecting diode portion of embodiment 1.

Now, the temperature detecting diode portion 43 may be constituted as follows. A configuration may include, for instance, as shown in FIG. 7, four symmetrical points in the first P-well 52, where second N+-diffusion regions 54 are disposed at two points on a diagonal line, and third N+-diffusion regions 55 are respectively disposed at two points on an opposing diagonal line. When arranged as shown in FIG. 7, the symmetry of arrangement of the temperature detecting diodes is high.

Figure 8:
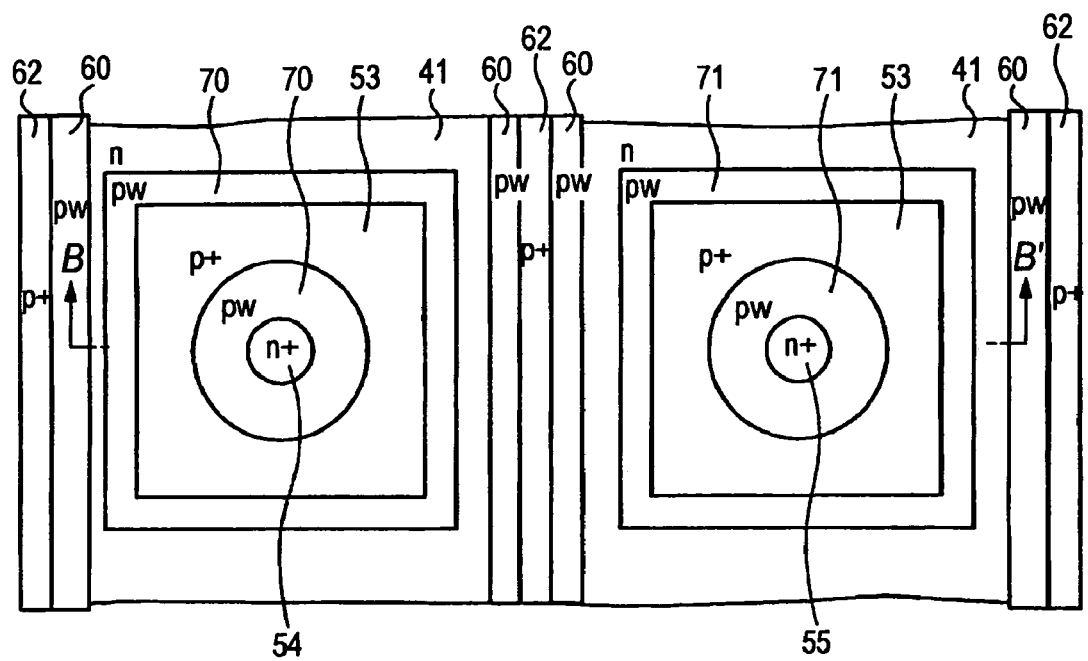
FIG. 8 is a plan view showing another example of a temperature detecting diode portion of embodiment 1.
Figure 9:
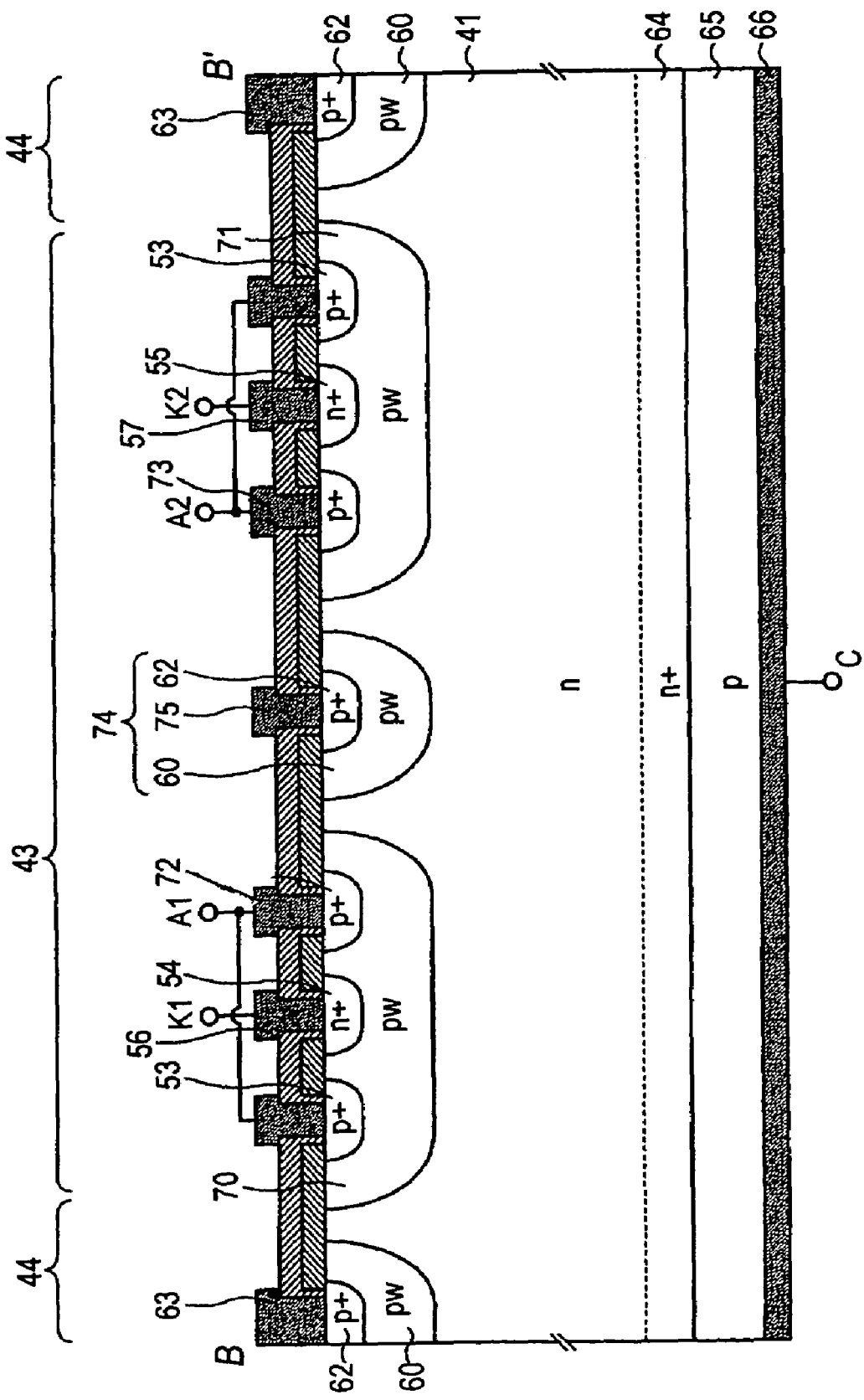
FIG. 9 is a sectional view showing a configuration in a cross-section B-B' of FIG. 8.

Furthermore, as shown in FIGS. 8 and 9, P-wells 70 and 71 that become an anode region may be disposed separately and a temperature detecting diode may be provided for each. In this case, for every anode region, anode electrodes 72 and 73 are provided. Furthermore, a diverter portion 74 made of the second P-well 60 and the third P+-diffusion region 62 is disposed between a diode of one P-well 70 and a diode of the other P-well 71, in order to secure the symmetry of the elements. An electrode 75 of the diverter portion 74 is also short-circuited to the emitter electrode 48 of the IGBT active portion 42 and similarly to an electrode 63 of the other diverter portion 44.

Figure 10:
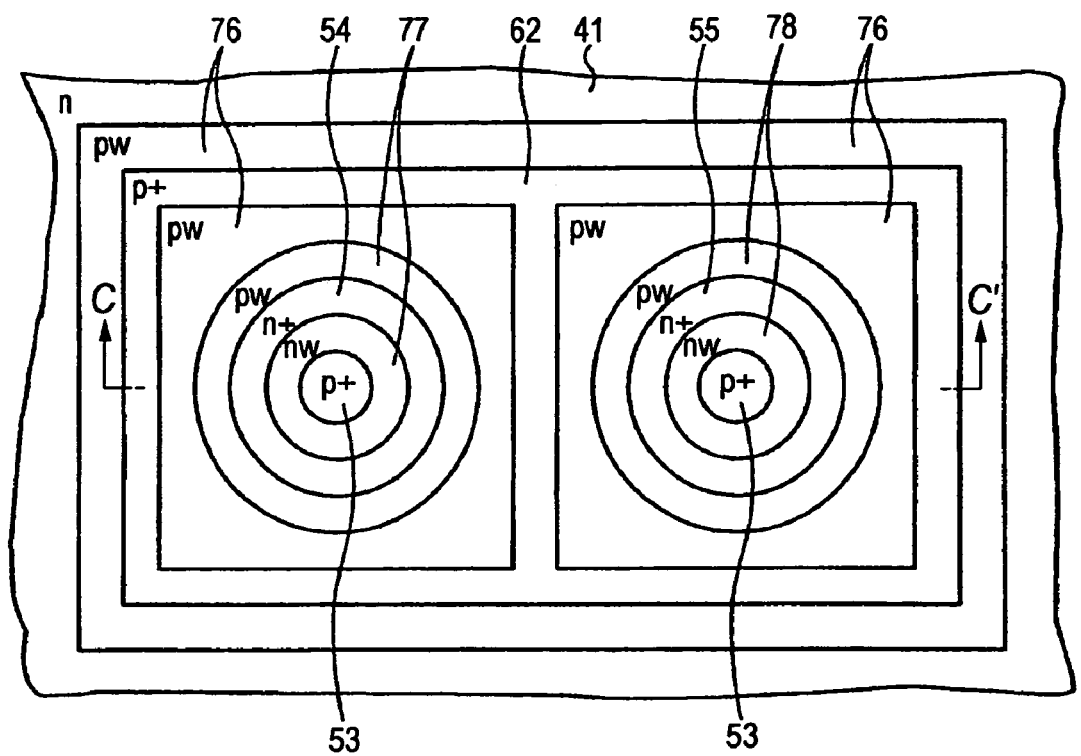
FIG. 10 is a plan view showing another example of a temperature detecting diode portion of embodiment 1.
Figure 11:
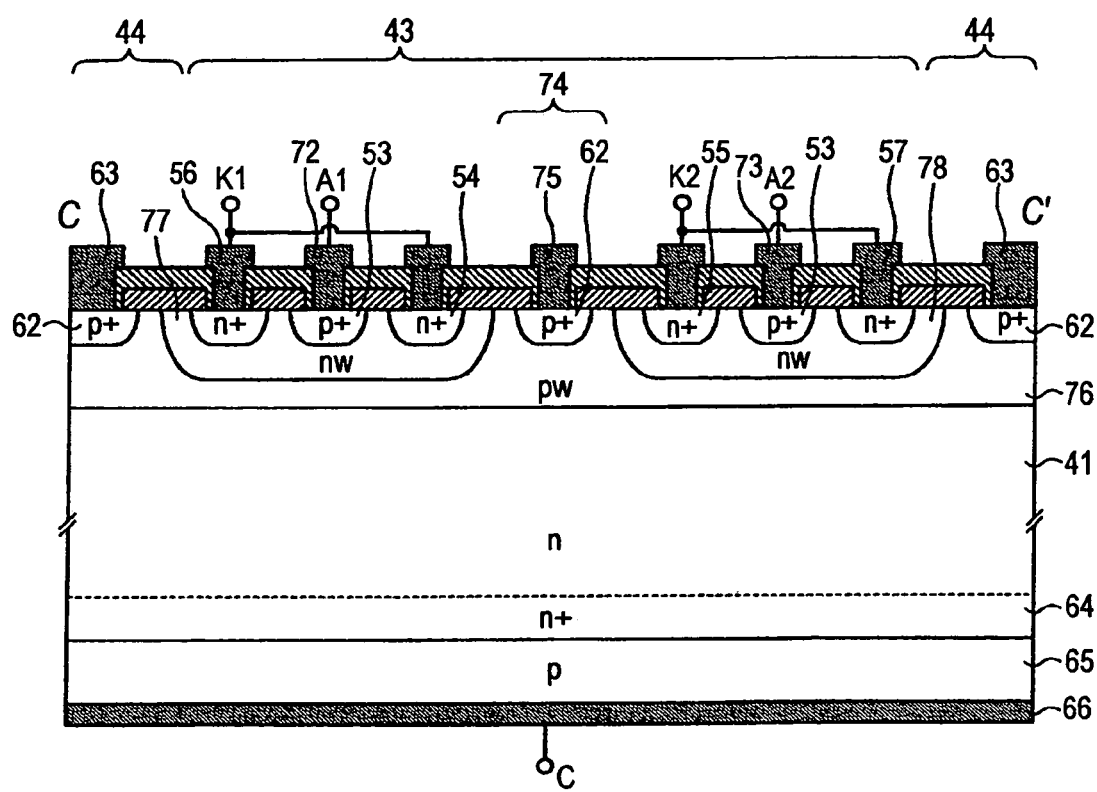
FIG. 11 is a sectional view showing a configuration in a cross-section C-C' of FIG. 10.

Still furthermore, as shown in FIGS. 10 and 11, a configuration where a P-well 76 is formed on a surface of the N-layer 41 so as to contain the temperature detecting diode portion 43 and the diverter portion 44, inside of the P-well 76 N-wells 77 and 78 are disposed separately, and a temperature detecting diode is provided for each thereof. Between a diode of one N-well 77 and a diode of the other N-well 78, a diverter portion 74 is disposed, in order to secure the symmetrical property of the elements. In this configuration, the P-well 76 combines a P-well of the diverter portions 44 and 74. According to this configuration, since a PN junction of the N-wells 77 and 78 and the P-well 76 is inversely biased, a junction separation structure is obtained. Accordingly, a parasitic diode (parasitic diode 10 in FIG. 1) constituted of an anode region of the temperature detecting diode portion 43 and the N-layer 41 is not present.

Figure 12:
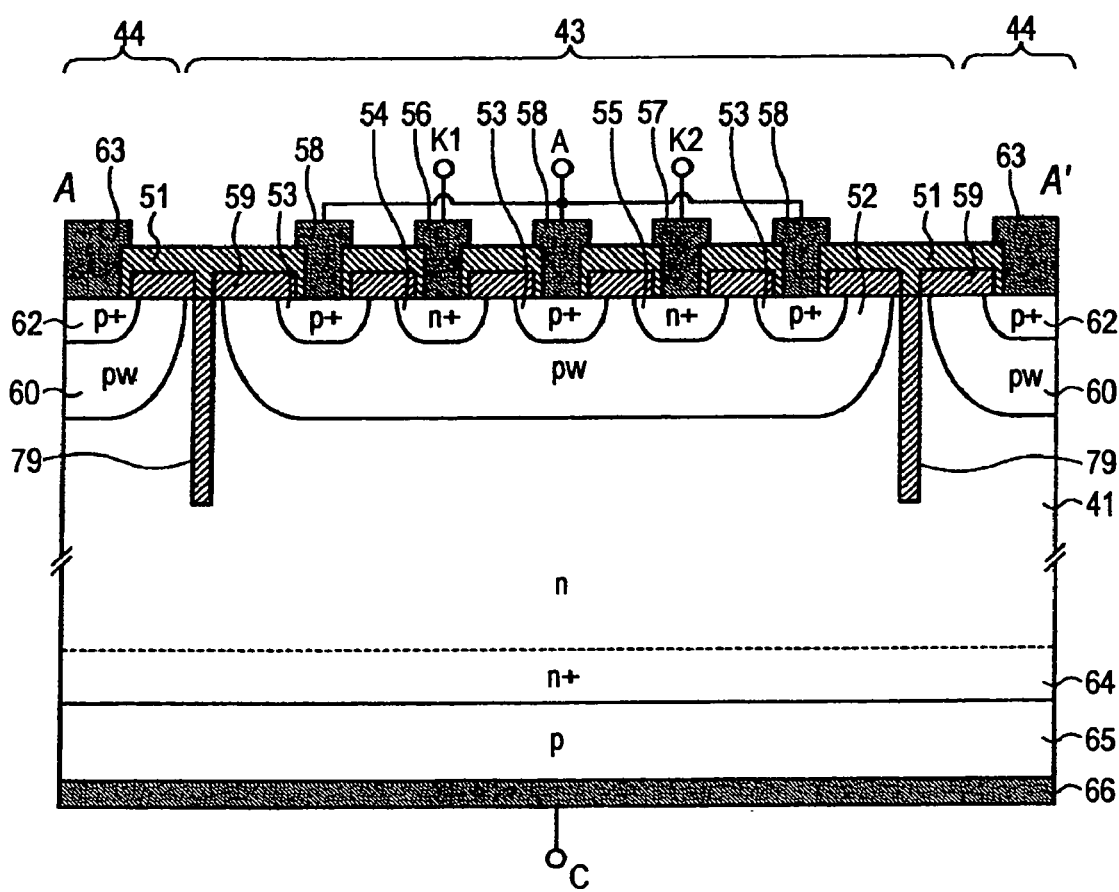
FIG. 12 is a sectional view showing another example of a configuration in a cross-section A-A' of FIG. 4.

Furthermore, a configuration may be implemented where, as shown in FIG. 12, a dielectric region 79 is provided extending downwardly from a surface of the N-layer 41, so as to surround the temperature detecting diode portion 43. When the dielectric region 79 is formed, a trench is formed in a surface of the N-layer 41 and the trench may be filled with at least one dielectric. According to this configuration, the parasitic PNP transistor 69 (FIG. 6) constituted of the first P-well 52 of the temperature detecting diode portion 43, the N-layer 41 and the second P-well 60 of the diverter portion 44 is energized only with difficulty.

Embodiment 2

Figure 13:
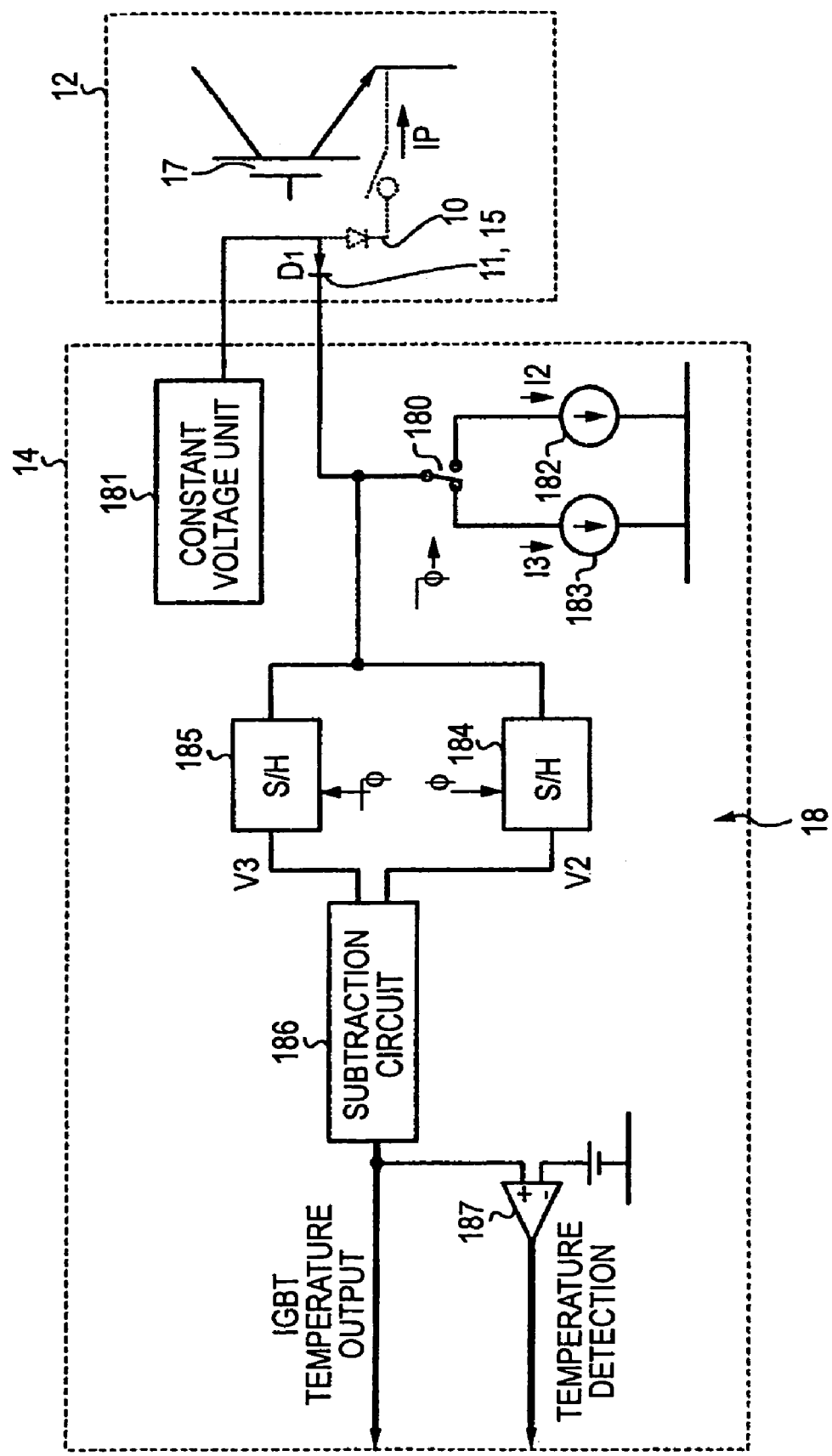
FIG. 13 is an equivalent circuit diagram showing a schematic configuration of a temperature measurement device according to embodiment 2.

FIG. 13 is an equivalent circuit diagram showing a schematic configuration of a temperature measurement device according to embodiment 2 of the invention. As shown in FIG. 13, in embodiment 2, a temperature sensor 11 is constituted of a single diode 15. An anode of the diode 15 is connected at an impedance of, for instance, 1 Ω or more, to a constant voltage unit 181 of a detection circuit 18. That is, a constant voltage is applied to the anode of the diode 15. Furthermore, a cathode of the diode 15 is connected, at an impedance of, for instance, 1 Ω or more and higher than that on the anode side, through a switch 180 to a first constant current source 182 and a second constant current source 183 of the detection circuit 18.

At a time φ, the switch 180 connects a cathode of the diode 15 and the first constant current source 182, and thereby a current I2 flows toward a cathode of the diode 15. On the other hand, at a time /φ ("/" before φ expresses a bar that means an inversion) obtained by inverting the clock φ as an inverted clock /φ, at the time /φ, the switch 180 connects a cathode of the diode 15 and the second constant current source 183, and thereby a current I3 flows toward a cathode side of the diode 15. That is, to the diode 15, different currents flow in a time-sharing manner.

Furthermore, a cathode of the diode 15 is connected to two sample and hold circuits 184 and 185 of the detection circuit 18. The first sample and hold circuit 184 samples a forward voltage V2 of the diode 15 at a time φ, and holds the sampled Voltage V2 at a time /φ. In comparison, the second sample and hold circuit 185 samples a forward voltage V3 of the diode 15 at a time /φ and holds the sampled voltage V3 at a time φ.

The detection circuit 18 is provided with a subtraction circuit 186. The subtraction circuit 186 obtains a difference (V3−V2) of the voltage V2 outputted from the first sample and hold circuit 184 and the voltage V3 outputted from the second sample and hold circuit 185, and based on the difference detects and outputs a temperature of the IGBT chip 12. Furthermore, a comparator 187 associated with the detection circuit 18 compares an output voltage of the subtraction circuit 186 and a voltage corresponding to a preset degree of overheating to detect overheating of the IGBT chip 12.

Figure 14:
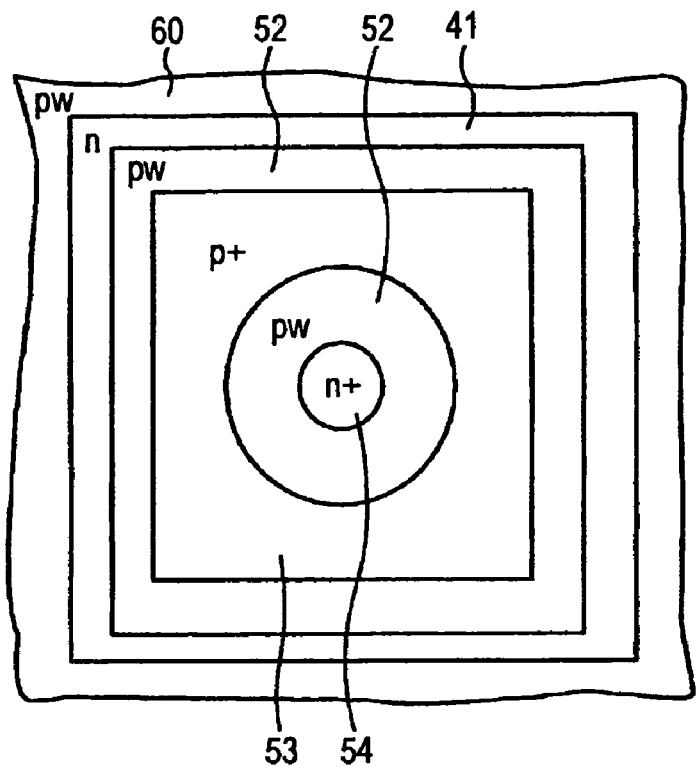
FIG. 14 is a plan view showing an example of a temperature detecting diode portion of embodiment 2.
Figure 15:
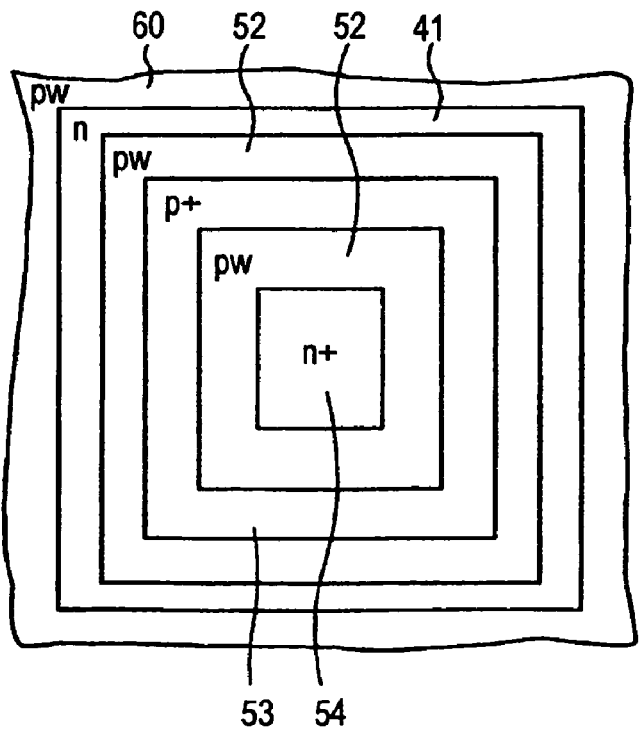
FIG. 15 is a plan view showing another example of a temperature detecting diode portion of embodiment 2.

One configuration of the IGBT chip 12 is a configuration where in embodiment 1 the third N+-diffusion region 55 is not disposed in the temperature detecting diode portion 43. In FIG. 14, an example of a configuration of a semiconductor surface of the temperature detecting diode portion is shown and another example is shown in FIG. 15. In the configuration shown in FIG. 14, inner first P-well 52 and second N+-diffusion region 54 are circular. However, the shapes thereof, as shown in FIG. 15, may be rectangular. Since other configurations are equivalent to the embodiment 1, further description thereof will be omitted.

Embodiment 3

Figure 16:
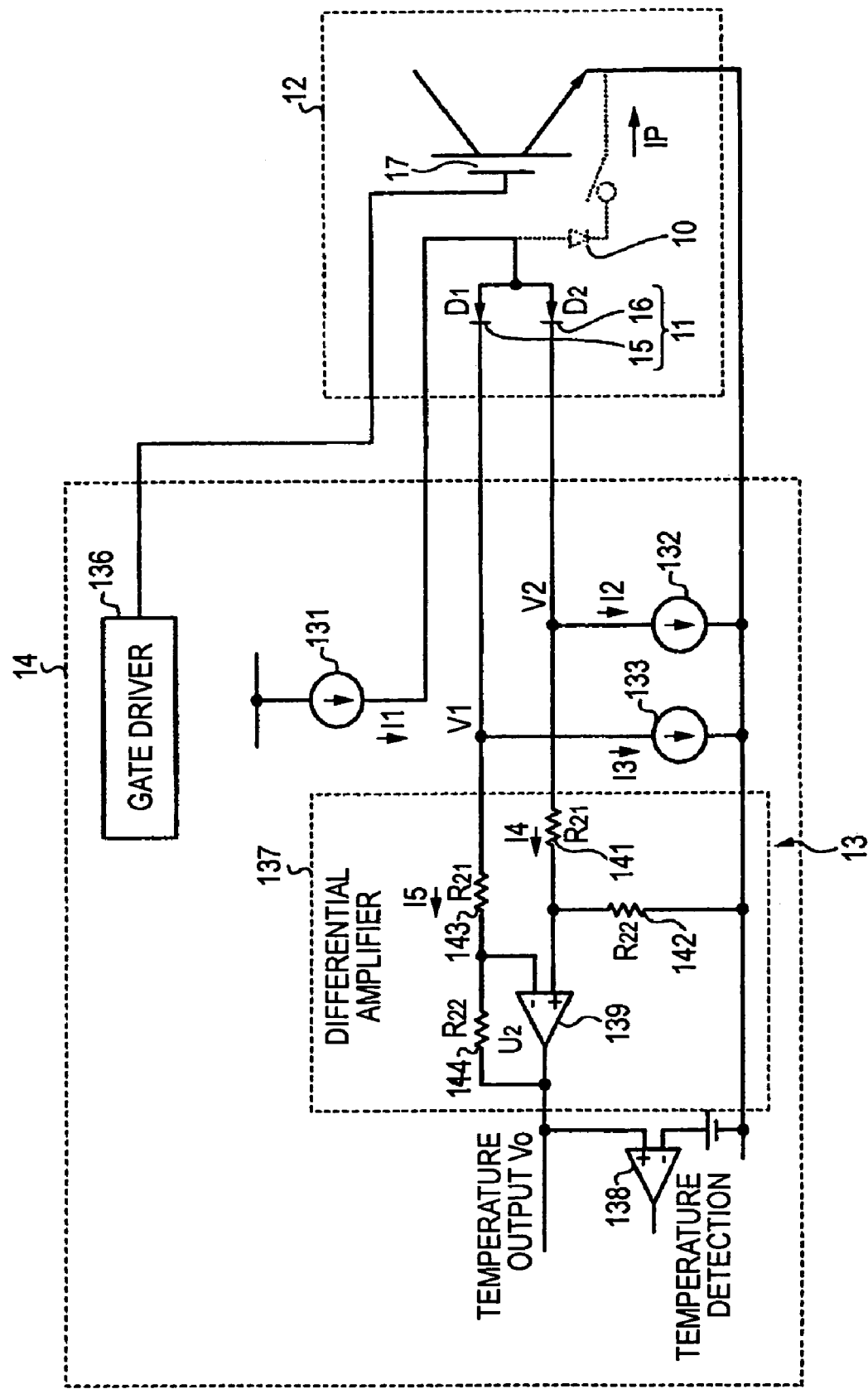
FIG. 16 is an equivalent circuit diagram showing a schematic configuration of a temperature measurement device according to embodiment 3.

FIG. 16 is an equivalent circuit diagram showing a schematic configuration of a temperature measurement device according to embodiment 3 of the invention. As shown in FIG. 16, in embodiment 3, a differential amplifier 137 and a comparator 138 are provided in place of the temperature detector 134 in the detection circuit 13 of embodiment 1. In FIG. 16, a part including the delay circuit 135 is omitted from the drawing. The differential amplifier 137 amplifies the difference between a forward voltage V1 and a forward voltage V2 of the temperature detecting first diode 15 and second diode 16 respectively, and outputs an output voltage Vo.

The differential amplifier 137 includes an operational amplifier 139 and four resistances 141, 142, 143 and 144. A cathode of the second diode 16 is connected to a non-inverting input terminal of the operational amplifier 139 through the first resistance 141. Further, the second resistance 142 is connected between the non-inverting input terminal of the operational amplifier 139 and a line of a reference potential. At an inverting input terminal of the operational amplifier 139, a cathode of the first diode 15 is connected through the third resistance 143. Still furthermore, the fourth resistance 144 is connected between the inverting input terminal of the operational amplifier 139 and an output terminal.

Similarly to embodiment 1, the currents supplied by the first constant current source 131 to the anode sides of the diodes 15 and 16, to the cathode side of the second diode 16 and to the cathode side of the first diode 15, and the current supplied by the parasitic diode 10, are respectively referred to as I1, I2, I3 and IP. Furthermore, the currents flowing in the first resistance 141 and the third resistance 143 are referred to as I4 and I5 respectively. In embodiment 3, I1 is necessarily larger than I2+I3+I4+I5+IP.

Still further, a condition that I5 is very small compared to I3 (condition 1) and a condition that I4 is very small compared to I2 (condition 2) are necessarily satisfied. When the resistance values of the first resistance 141 and the third resistance 143 are equal to $R_{21}$ and the resistance values of the second resistance 142 and the fourth resistance 144 are equal to $R_{22}$, the values of $R_{21}$ and $R_{22}$ are selected so as to satisfy conditions 1 and 2.

I2 and I3 are substantially several tens to several hundreds of μA and I4 and I5 are substantially several hundreds of nA to several μA. Accordingly, when V1 and V2 are, for instance, substantially 10 V, a value of ($R_{21}+R_{22}$) of a total sum of $R_{21}$ and $R_{22}$ is several tens to several hundreds of MΩ. Furthermore, an output voltage Vo of the operational amplifier 139 is expressed by equation (5) below.

$$Vo = R_{22}/R_{21} \times (V2-V1) \tag{5}$$

Similarly to embodiment 2, a comparator 138 of the detection circuit 13 compares the output voltage Vo of the operational amplifier 137 that is an output of the detection circuit 13 and a voltage corresponding to preset overheating to detect overheating of the IGBT chip 12. The configuration of the IGBT chip 12, being similar to that of embodiment 1, will not be described here.

Embodiment 4

Figure 17:
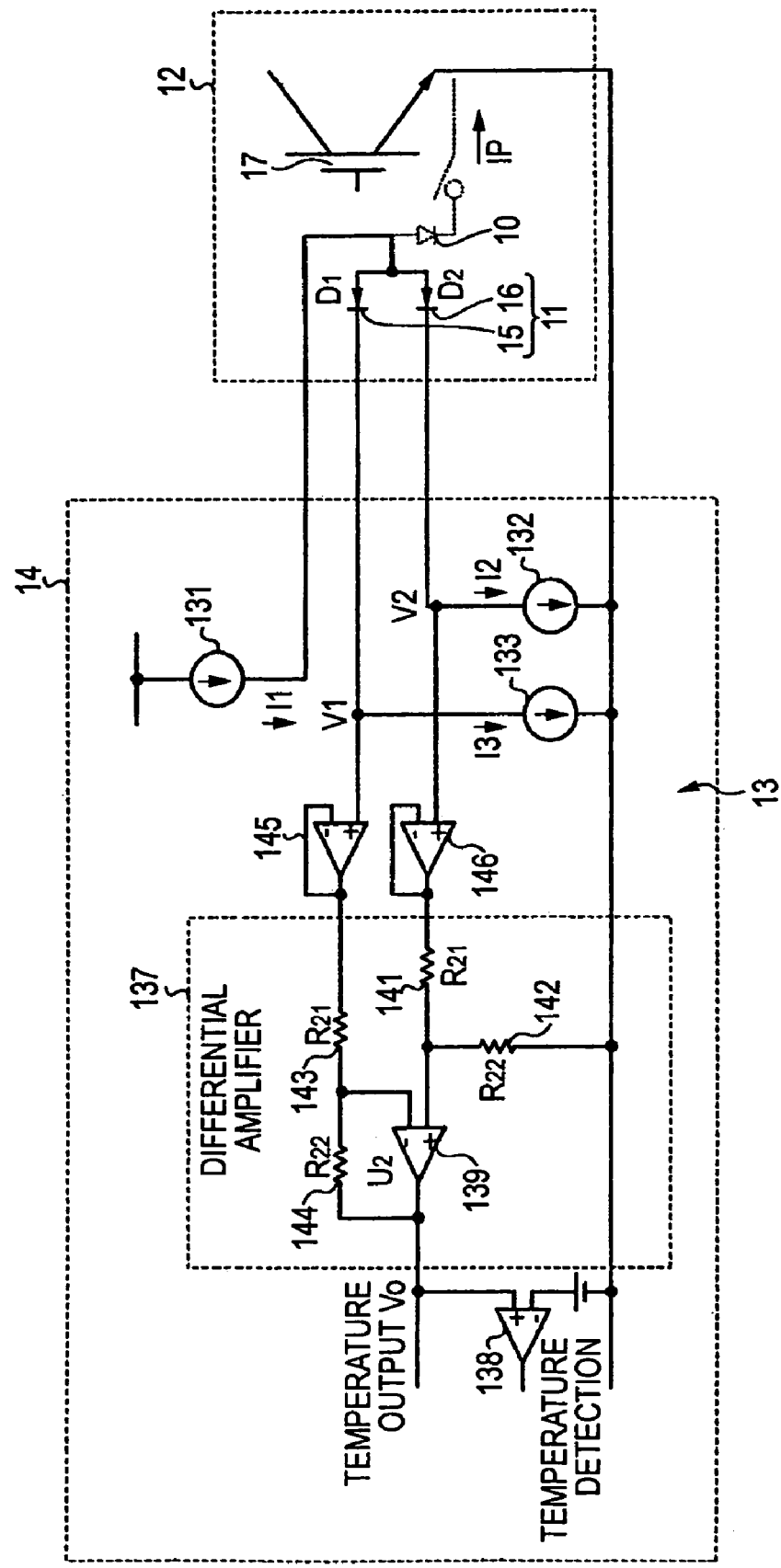
FIG. 17 is an equivalent circuit diagram showing a schematic configuration of a temperature measurement device according to embodiment 4.

FIG. 17 is an equivalent circuit diagram showing a schematic configuration of a temperature measurement device according to embodiment 4 of the invention. As shown in FIG. 17, in embodiment 4, in the detection circuit 13 of embodiment 3 shown in FIG. 16, a first buffer amplifier 145 is disposed between a cathode of the first diode 15 and a differential amplifier 137, and a second buffer amplifier 146 having the same configuration as that of the first buffer amplifier 145 is disposed between a cathode of the second diode 16 and the differential amplifier 137.

The forward voltage of the first diode 15 and the forward voltage of the second diode 16, are respectively amplified in current by the first buffer amplifier 145 and by the second buffer amplifier 146, followed by inputting into the differential amplifier 137. According to embodiment 4, since there is no restriction such as mentioned above on values $R_{21}$ and $R_{22}$ of the four resistances 141, 142, 143 and 144 that constitute the differential amplifier 137, the first resistance 141, second resistance 142, third resistance 143 and fourth resistance 144 can be readily integrated on a chip 14 of the integrated circuit.

Embodiment 5

Figure 18:
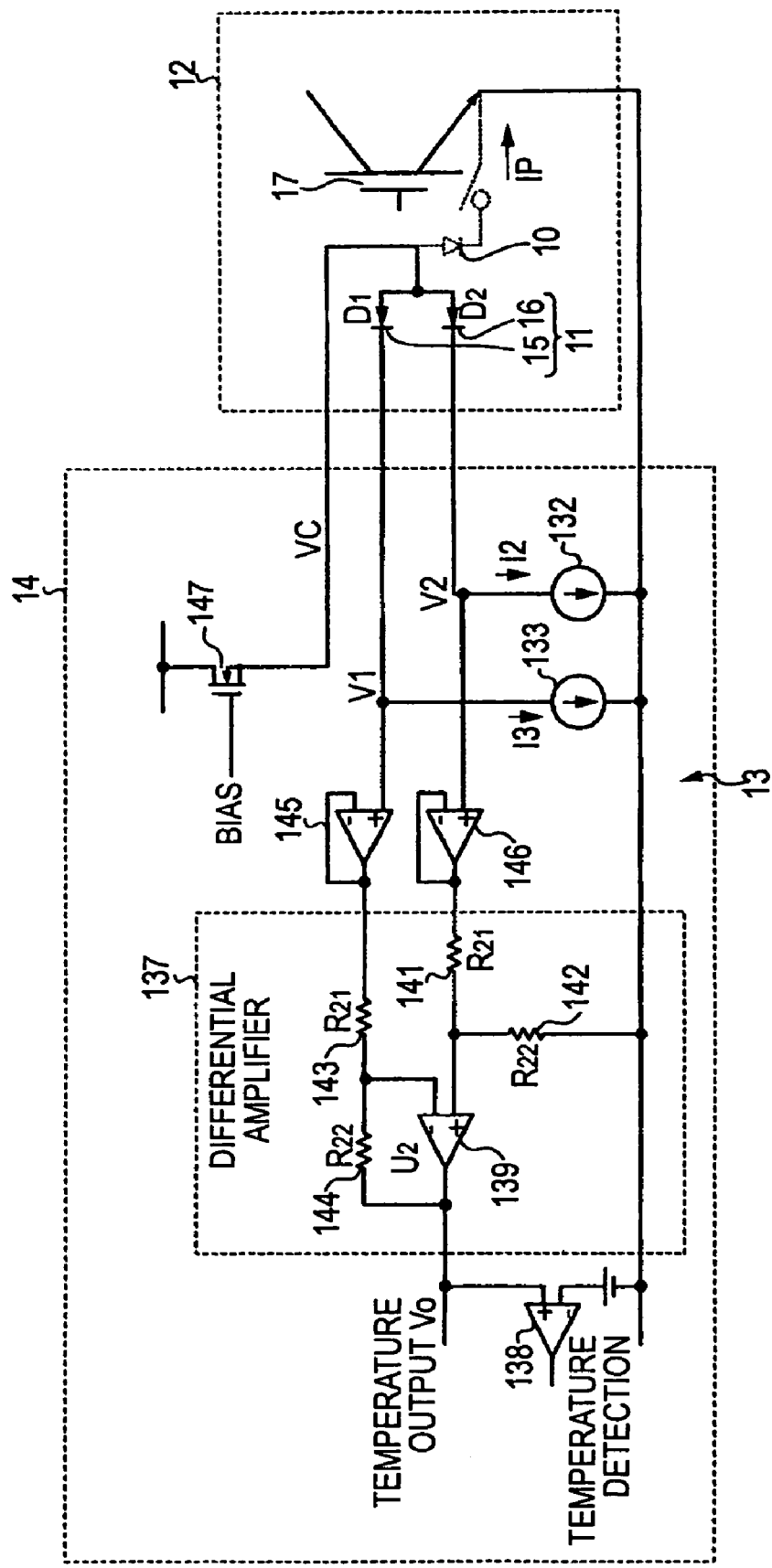
FIG. 18 is an equivalent circuit diagram showing a schematic configuration of a temperature measurement device according to embodiment 5.

FIG. 18 is an equivalent circuit diagram showing a schematic configuration of a temperature measurement device according to embodiment 5 of the invention. As shown in FIG. 18, in embodiment 5, in the detection circuit 13 according to embodiment 4 shown in FIG. 17, in place of the first constant current source 131, a constant voltage source 147 is connected to the anodes of the diodes 15 and 16. That is, a constant voltage VC is applied to the anodes of diodes 15 and 16. Similarly to embodiment 1, currents flowing to the respective cathode sides of the second diode 16 and first diode 15 are expressed as I2 and I3, and a current flowing from the parasitic diode 10 is expressed as IP.

The constant voltage source 147 has the capability of driving a current (I2+I3+IP) obtained as a total sum of I2, I3 and IP. According to embodiment 5, even when the IGBT 17 is turned on and thereby a parasitic diode 10 is energized to generate the parasitic current IP, alternatively even when the IGBT 17 is turned off and the parasitic diode 10 is not energized, that is, the parasitic current IP does not flow, the anode voltage of the diodes 15 and 16 is maintained constant at a voltage VC. Accordingly, irrespective of a state of the IGBT 17, stable temperature detection and temperature output can be obtained.

Embodiment 6

Figure 19:
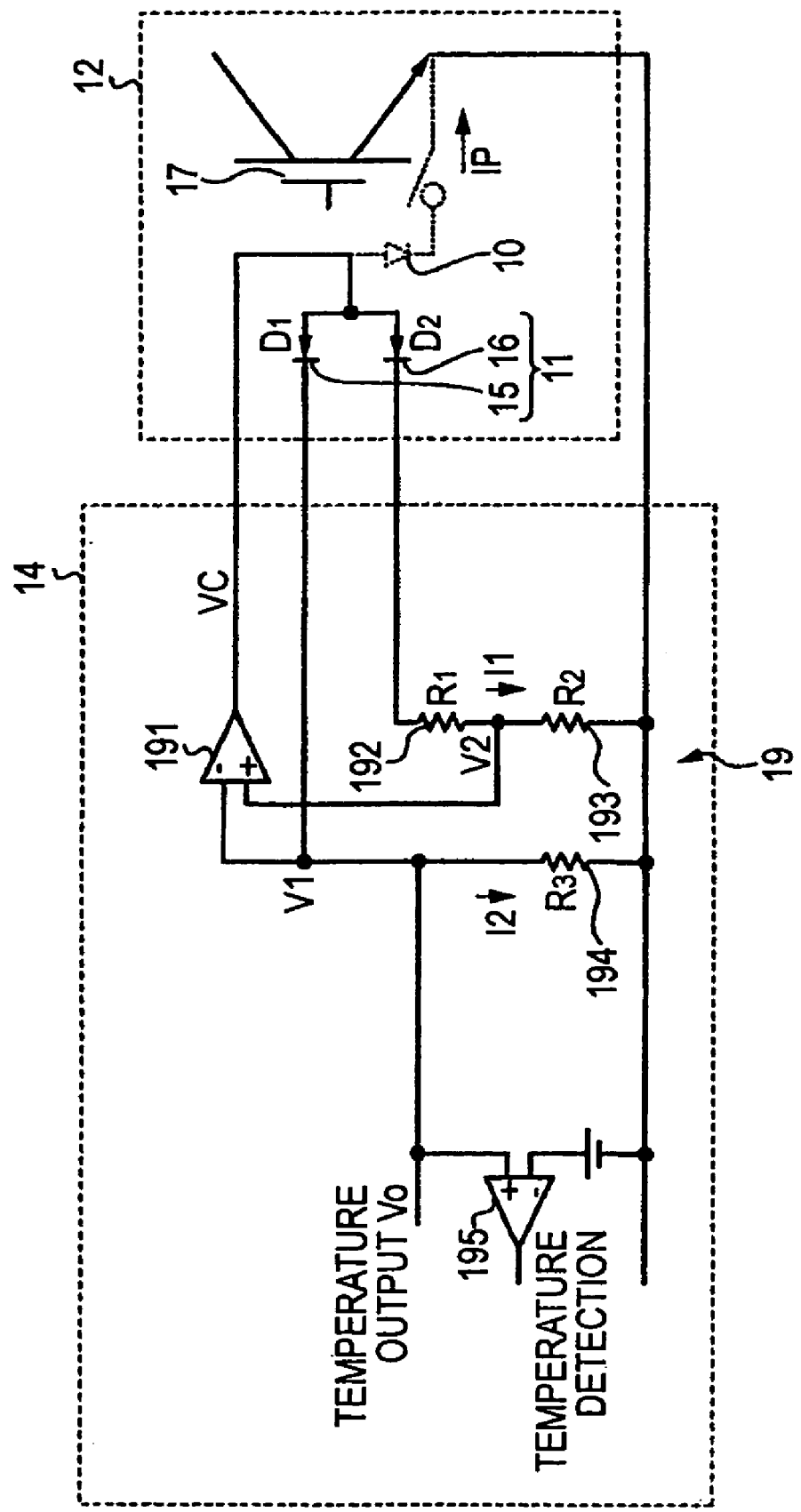
FIG. 19 is an equivalent circuit diagram showing a schematic configuration of a temperature measurement device according to embodiment 6.
Figure 20:
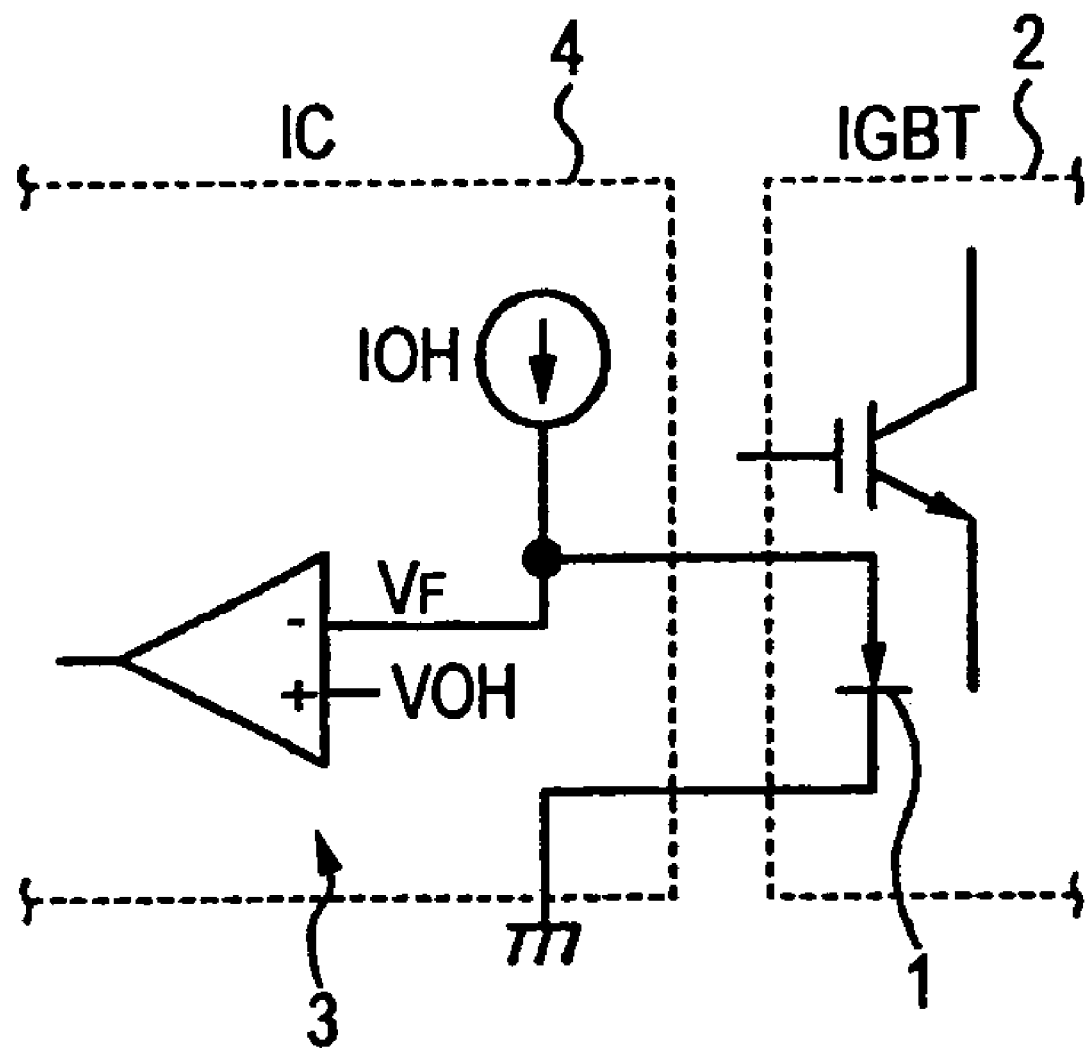
FIG. 20 is an equivalent circuit diagram showing a schematic configuration of an existing temperature measurement device.

FIG. 19 is an equivalent circuit diagram showing a schematic configuration of a temperature measurement device according to embodiment 6 of the invention. As shown in FIG. 19, embodiment 6 is another example where a constant voltage source is connected to anodes of the temperature detecting diodes 15 and 16, and a feedback control of an operational amplifier is utilized as a constant voltage source. The detection circuit 19 has an operational amplifier 191, three resistances 192, 193 and 194 and a comparator 195.

A cathode of the first diode 15 is connected to an inverting input terminal of the operational amplifier 191. A cathode of the second diode 16 is connected To a non-inverting input terminal of the operational amplifier 191 through the first resistance 192. An output terminal of the operational amplifier 191 is connected to anodes of the diodes 15 and 16. Furthermore, the second resistance 193 is connected between a connection node of the non-inverting input terminal of the operational amplifier 191 and the first resistance 192 and a line of a reference potential. The third resistance 194 is connected between a connection node of the inverting input terminal of the operational amplifier 191 and a cathode of the first diode 15 and a line of a reference potential.

Resistance values of the first resistance 192, second resistance 193 and third resistance 194 are respectively expressed as $R_1$, $R_2$ and $R_3$, and current values flowing through the second resistance 193 and third resistance 194 are respectively expressed as $I_1$ and $I_2$. Furthermore, input voltages at an inverting input terminal and non-inverting input terminal of the operational amplifier 191 are expressed as V1 and V2 respectively. Equations (6) and (7) below hold in an imaginary short state of the operational amplifier 191. Then, when resolving with an approximation equation (8) of the equation (1), equations (9) through (11) below can be obtained.

$$I_2 \times R_3 = I_1 \times R_2 \tag{6}$$

$$V1 = V2 + R_1 \times I_1 \tag{7}$$

$$I = Is \times \{\exp(qV/kT)-1\} \cong Is \times \exp(qV/kT) \tag{8}$$

$$I_1 = kT/q \times \ln(R_2/R_3)/R_1 \tag{9}$$

$$I_2 = kT/q \times \ln(R_2/R_3) \times R_2/(R_1 \times R_3) \tag{10 and}$$

$$Vo = kT/q \times \ln(R_2/R_3) \times R_2/R_1 \tag{11}$$

As obvious from equation (11), an output voltage Vo of the detection circuit 19 becomes a value proportionate to a temperature of the IGBT chip 12. Furthermore, similarly to embodiment 2, a comparator 195 of the detection circuit 19 compares the output voltage Vo of the detection circuit 19 and a voltage corresponding to a preset degree of overheating to detect overheating of the IGBT chip 12. According to embodiment 6, even when a parasitic current IP flows owing to the parasitic diode 10 between the anodes of the diodes 15 and 16 and an emitter of the IGBT 17, owing to the operational amplifier 191, the anode voltages of the diodes 15 and 16 are maintained at a constant voltage of VC. Accordingly, irrespective of a state of the IGBT 17, stable temperature detection and temperature output can be obtained. Furthermore, in comparison with embodiment 5, fewer operational amplifiers are employed. Accordingly, the detection circuit 19 becomes smaller in size and advantageous from a viewpoint of cost.

As described above, according to the respective embodiments, a forward voltage difference proportional to a temperature can be obtained with high precision. Accordingly, with less frequent adjustment operations, alternatively or without any adjustment operations, the temperature of the IGBT chip 12 can be detected precisely. Furthermore, since latch-up owing to the operation of the parasitic thyristor can be inhibited from occurring, the temperature sensor 11 and the detection circuits 13 and 18 can be protected from being damaged. Still furthermore, according to embodiment 1, a forward voltage difference proportional to a temperature of the IGBT chip 12 can be constantly obtained.

In the above description, the invention can be variously modified without restriction to the above-described embodiments. For instance, the two temperature detecting diodes 15 and 16 of embodiment 1 and the temperature detecting diode 15 of embodiment 2 can be constituted by connecting a plurality of diodes in series. When thus configured, a forward voltage of the temperature detecting diode, that is, an output voltage of the temperature sensor 11 can be increased.

Furthermore, P-type regions of the diverter portions 44 and 74 may be formed deeper than the anode region (first P-well 52) of the temperature detecting diode portion 43. Still furthermore, an SOI (Silicon On Insulator) structure where an N-layer 41 is disposed on an insulating layer may be adopted. Furthermore, since numerical values such as dimensions described in the embodiments are only examples, the invention is not restricted thereto. Still furthermore, the invention can be similarly applied to a case where the power semiconductor device is a power MOSFET.

As mentioned above, a temperature measurement device of a power semiconductor device according to the invention is a power converter that uses a power semiconductor device and more particularly preferably a power converter where an IGBT and a driving circuit thereof are separately configured.

What is claimed is:

1. A temperature measurement device of a power semiconductor device comprising:
    a plurality of temperature detecting diodes formed on a first chip having a power semiconductor device; and
    a detection circuit that is formed on a second chip and controls the power semiconductor device, the detection circuit being connected to the temperature detecting diodes;
    wherein the detection circuit detects a temperature of the power semiconductor device based on a difference between forward voltages of the temperature detecting diodes when currents different in current value are flowing in the respective temperature detecting diodes, and
    the forward voltages of the respective temperature detecting diodes, which are different in magnitude, are each inputted into a differential amplifier to amplify the voltage difference between the respective temperature detecting diodes, through separate buffer amplifiers having the same configuration as the differential amplifier.

2. The temperature measurement device of the power semiconductor device according to claim 1, wherein each of the temperature detecting diodes is connected to the detection circuit at an impedance of 1 Ω or more both on an anode side and a cathode side and at an impedance higher on the cathode side than the anode side.

3. The temperature measurement device of the power semiconductor device according to claim 1, wherein cathodes of the respective temperature detecting diodes are independently connected to the detection circuit and anodes of the respective temperature detecting diodes are connected to the detection circuit in common.

4. The temperature measurement device of the power semiconductor device according to claim 1, wherein anodes of the respective temperature detecting diodes are connected to a constant voltage source.

5. The temperature measurement device of the power semiconductor device according to claim 1, wherein anodes of the respective temperature detecting diodes are connected to a current limiter.

6. The temperature measurement device of the power semiconductor device according to claim 5, wherein the current limiter is a constant current source.

7. A temperature measurement device of a power semiconductor device, comprising:
    a plurality of temperature detecting diodes formed on a first chip having a power semiconductor device; and
    a detection circuit that is formed on a second chip and controls the power semiconductor device, the detection circuit being connected to the temperature detecting diodes;
    wherein the detection circuit detects a temperature of the cower semiconductor device based on a difference between forward voltages of the temperature detecting diodes when currents different in current value are flowing in the respective temperature detecting diodes,
    the temperature detecting diodes are symmetrically arranged in an in-plane layout, and
    an external periphery of each of the temperature detecting diodes is surrounded by a P-type semiconductor region to which a potential substantially equal to a reference potential of the power semiconductor device is applied and an anode region of each of the temperature detecting diodes is at least 100 μm apart from an end of a power semiconductor device side of the P-type semiconductor region.

8. The temperature measurement device of the power semiconductor device according to claim 7, wherein an N-type semiconductor region is interposed between the P-type semiconductor region and an anode region of each of the temperature detecting diodes, and the withstand voltage between the anode region and the P-type semiconductor region is larger than an input voltage to the anode region.

9. The temperature measurement device of the power semiconductor device according to claim 7, wherein the P-type semiconductor region and an anode region of each of the temperature detecting diodes are at least 1 μm apart with an N-type semiconductor region interposed therebetween.

10. The temperature measurement device of the power semiconductor device according to claim 7, wherein an external periphery of each of the temperature detecting diodes is surrounded with a dielectric material.

* * * * *